(12) United States Patent
Low et al.

(10) Patent No.: US 12,625,170 B2
(45) Date of Patent: May 12, 2026

(54) LOCALIZED IR DROP DETECTION AND CALIBRATION SCHEME TO CREATE HIGH ACCURACY VOLTAGE SUPPLY ACROSS PHYSICAL CIRCUIT PARTITIONS FOR PERFORMANCE GAIN

(71) Applicant: Intel Corporation, Santa Clara, CA (US)

(72) Inventors: Chia How Low, Simpang Ampat (MY); Roger Cheng, Campbell, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/972,360

(22) Filed: Oct. 24, 2022

(65) Prior Publication Data

US 2024/0133925 A1 Apr. 25, 2024
US 2024/0230725 A9 Jul. 11, 2024

(51) Int. Cl.
*G01R 31/28* (2006.01)
*G01R 19/10* (2006.01)

(52) U.S. Cl.
CPC .................................... *G01R 19/10* (2013.01)

(58) Field of Classification Search
CPC ............................ G01R 19/10; G01R 31/2818
See application file for complete search history.

(56) References Cited

U.S. PATENT DOCUMENTS

| | | | |
|---|---|---|---|
| 9,438,025 B1 * | 9/2016 | Athan | H02H 3/087 |
| 2006/0273818 A1 * | 12/2006 | Takemoto | G01R 31/31926 |
| | | | 324/762.02 |
| 2009/0102600 A1 * | 4/2009 | Noe | A01M 31/002 |
| | | | 340/3.1 |
| 2013/0205104 A1 * | 8/2013 | Hesse | G05B 19/045 |
| | | | 711/154 |
| 2016/0274178 A1 * | 9/2016 | Goel | G01R 31/318307 |
| 2021/0255659 A1 * | 8/2021 | Chen | G06F 1/324 |
| 2021/0390458 A1 * | 12/2021 | Blumstein | G06N 20/00 |
| 2021/0396805 A1 * | 12/2021 | Yun | G01R 31/2884 |
| 2022/0342841 A1 * | 10/2022 | Choudhary | G06F 13/4291 |

* cited by examiner

*Primary Examiner* — Dominic E Hawkins
(74) *Attorney, Agent, or Firm* — NICHOLSON DE VOS WEBSTER & ELLIOTT LLP

(57) ABSTRACT

Embodiments herein relate to a circuit for evaluating the ground voltage of each circuit partition of a number of circuit partitions, one partition at a time. Once the ground voltage is determined, a corresponding code is stored to control a leakage circuit coupled to the ground node. The leakage circuit provides a leakage current based on the code to offset the ground voltage to a target voltage, which may be common for each of the partitions. The circuit can include a voltage source which supplies a stair step increasing voltage to a comparator. The comparator compares the voltage of the voltage source to the ground node voltage and provides an output which changes when the two input voltages are approximately equal, within a tolerance. The circuit may include a finite state machine for managing the process.

20 Claims, 14 Drawing Sheets

Vdd2 (1.1 V)

304

Vdiff_max≥1.1 V

302

Vss

Vdd2 (1.1 V)

354

Vdiff_max≤1.0 V

352

Vsshi (0.2*Vdd2)

Vdd2 (1.1 V)

402

406    404

Ppredrv=1.1-0.22 V 410    408

416

Ron 412

R    414

422

424    418

430    400

| Aging degradation | Client DDR with Vsshi comp. | Server DDR w/o Vsshi comp. |
|---|---|---|
| %Id (<x%) | x1<x | x2>x |
| %BTI (<y%) | y1<y | y2>y |
| %HCI (<z%) | z1<z | z2>z |

| cal_sel<5:0> | Voffset | leak_n<3:0> |
|---|---|---|
| 39 | 70 mV | 15 |
| 38 | 60 mV | 14 |
| 37 | 50 mV | 13 |
| 36 | 40 mV | 12 |
| 35 | 30 mV | 11 |
| 34 | 20 mV | 10 |
| 33 | 10 mV | 9 |
| 32 | 0 mV | 8 |
| 31 | -10 mV | 7 |
| 30 | -20 mV | 6 |
| 29 | -30 mV | 5 |
| 28 | -40 mV | 4 |
| 27 | -50 mV | 3 |
| 26 | -60 mV | 2 |
| 25 | -70 mV | 1 |

Fig. 11

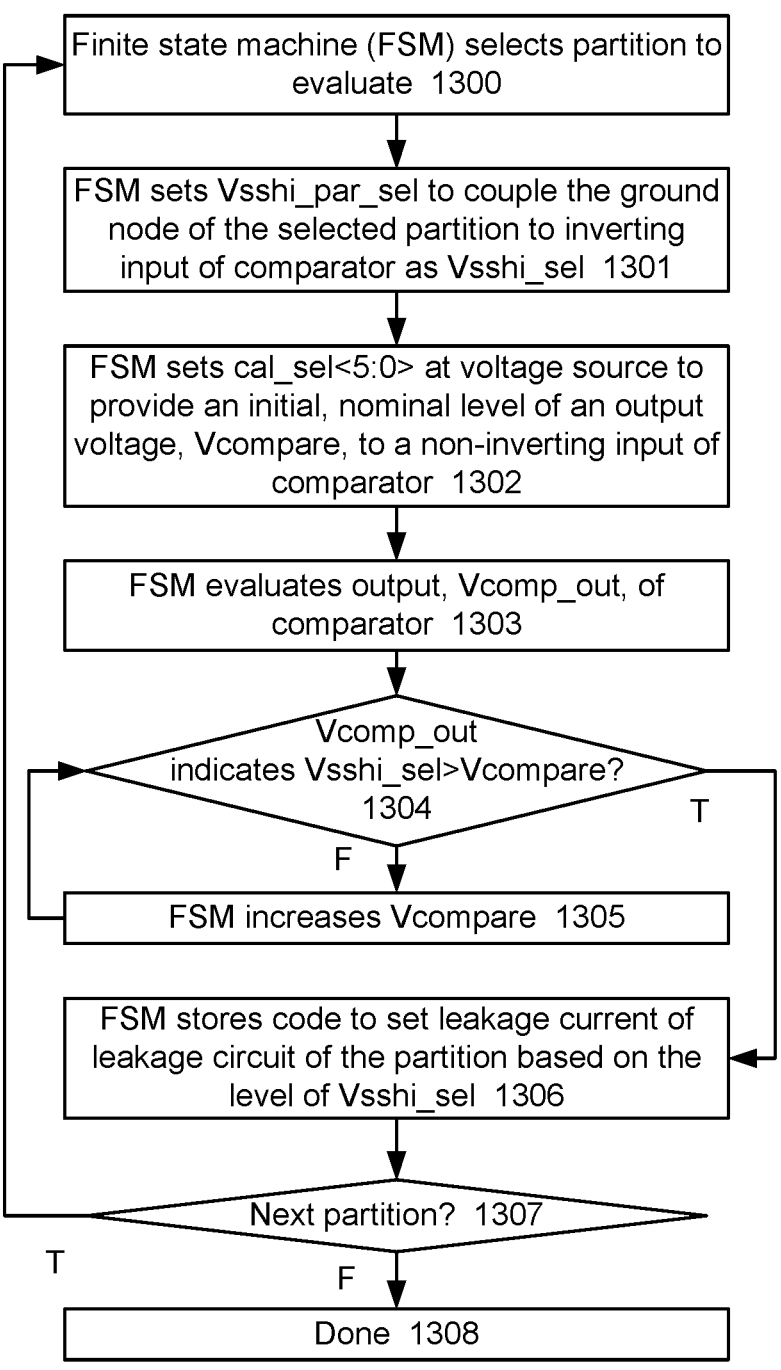

Finite state machine (FSM) selects partition to evaluate 1300

FSM sets Vsshi_par_sel to couple the ground node of the selected partition to inverting input of comparator as Vsshi_sel 1301

FSM sets cal_sel<5:0> at voltage source to provide an initial, nominal level of an output voltage, Vcompare, to a non-inverting input of comparator 1302

FSM evaluates output, Vcomp_out, of comparator 1303

Vcomp_out indicates Vsshi_sel>Vcompare? 1304

T

F

FSM increases Vcompare 1305

FSM stores code to set leakage current of leakage circuit of the partition based on the level of Vsshi_sel 1306

Next partition? 1307

T

F

Done 1308

LOCALIZED IR DROP DETECTION AND CALIBRATION SCHEME TO CREATE HIGH ACCURACY VOLTAGE SUPPLY ACROSS PHYSICAL CIRCUIT PARTITIONS FOR PERFORMANCE GAIN

FIELD

The present application generally relates to the field of computing devices and more particular to regulating the ground voltages of circuit partitions.

BACKGROUND

A computing system can be partitioned into a related set of functional blocks (e.g., interfaces/peripherals such as Universal Serial Bus (USB), Peripheral Component Interconnect Express (PCIe) and Double Data Rate (DDR)), where each block includes respective circuits. An interface such as DDR PHY has partitioning into different functional blocks to allow the system to be more efficiently managed. However, because of their different locations on a DDR PHY (physical layer), various challenges are presented in supplying voltages to the different blocks (also referred to as partitions).

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

2

Figures 9A, 9B:
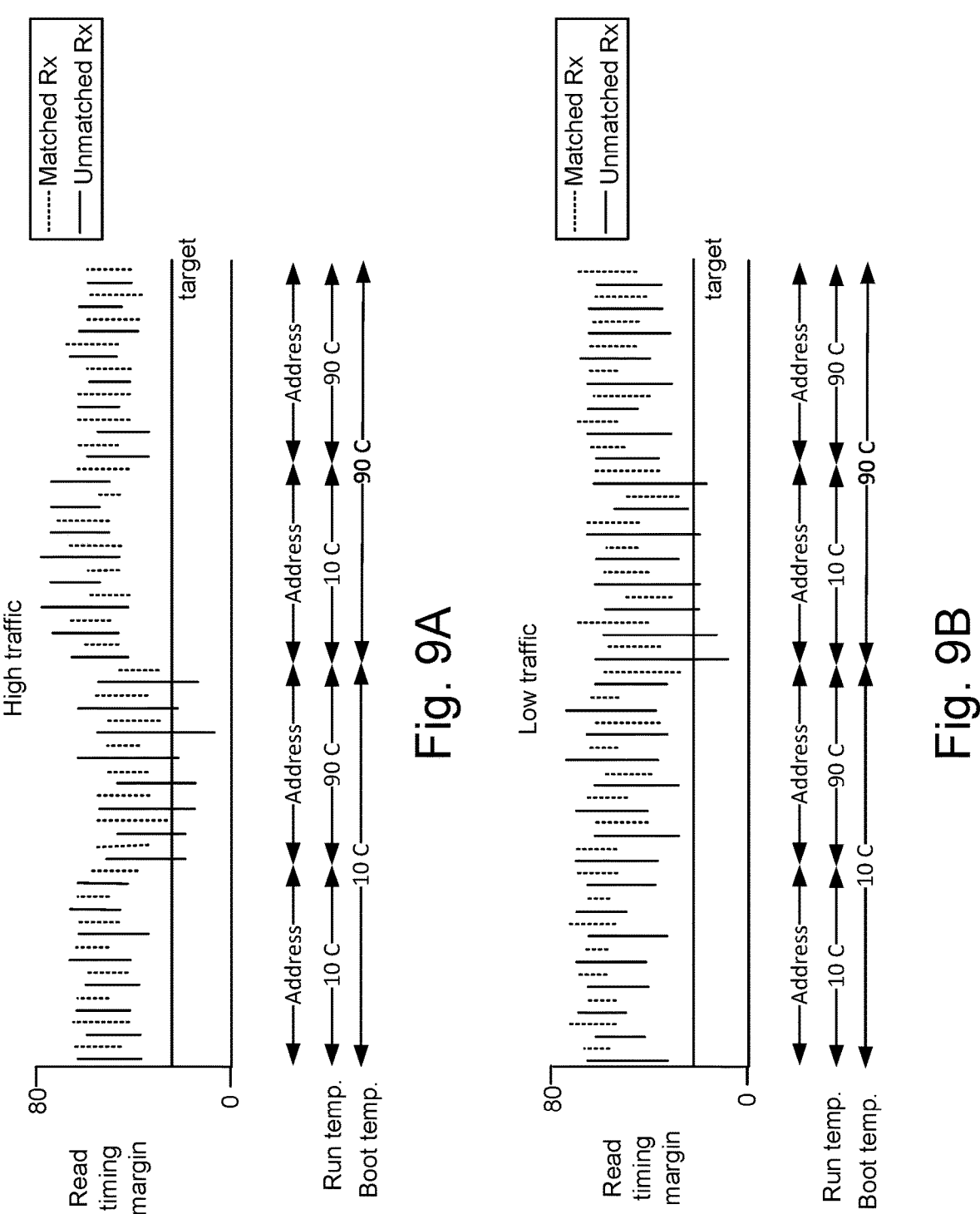

FIG. 9A depicts example plots of read timing margin (left side eye) across multiple data partitions, for different temperatures, in accordance with various embodiments.

FIG. 9B depicts example plots of read timing margin (right side eye) across multiple data partitions, for different temperatures, in accordance with various embodiments.

Figure 10A:
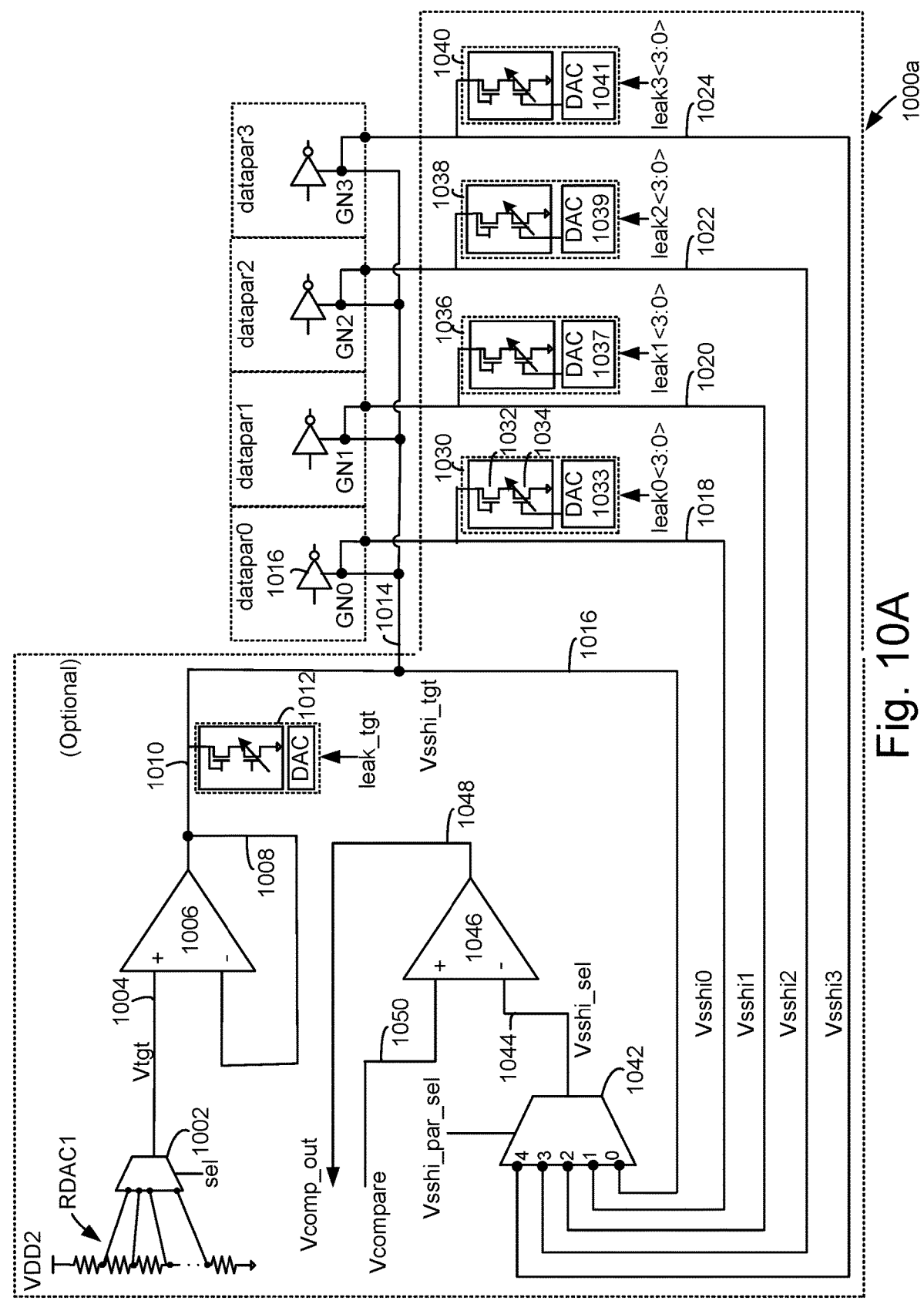

FIG. 10A depicts a circuit portion 1000a for regulating ground node voltages of data partitions, in accordance with various embodiments.

Figure 10B:
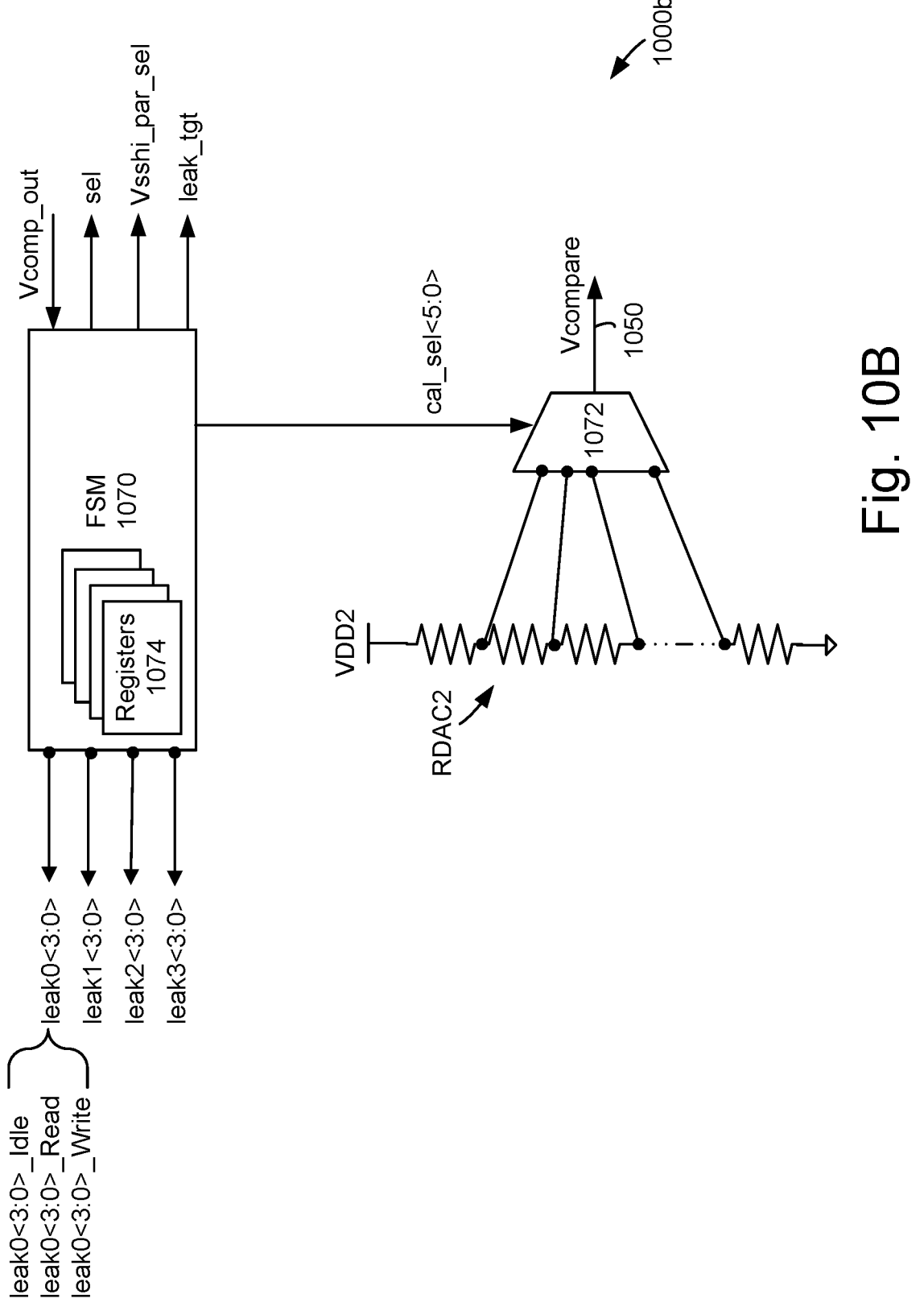

FIG. 10B depicts a circuit portion 1000b for regulating ground node voltages of data partitions, together with the circuit portion 1000a of FIG. 10A, in accordance with various embodiments.

FIG. 11 depicts an example table of codes for adjusting the leakage current in the leakage circuits 1030, 1036, 1038 and 1040 of FIG. 10A, in accordance with various embodiments.

Figure 12:
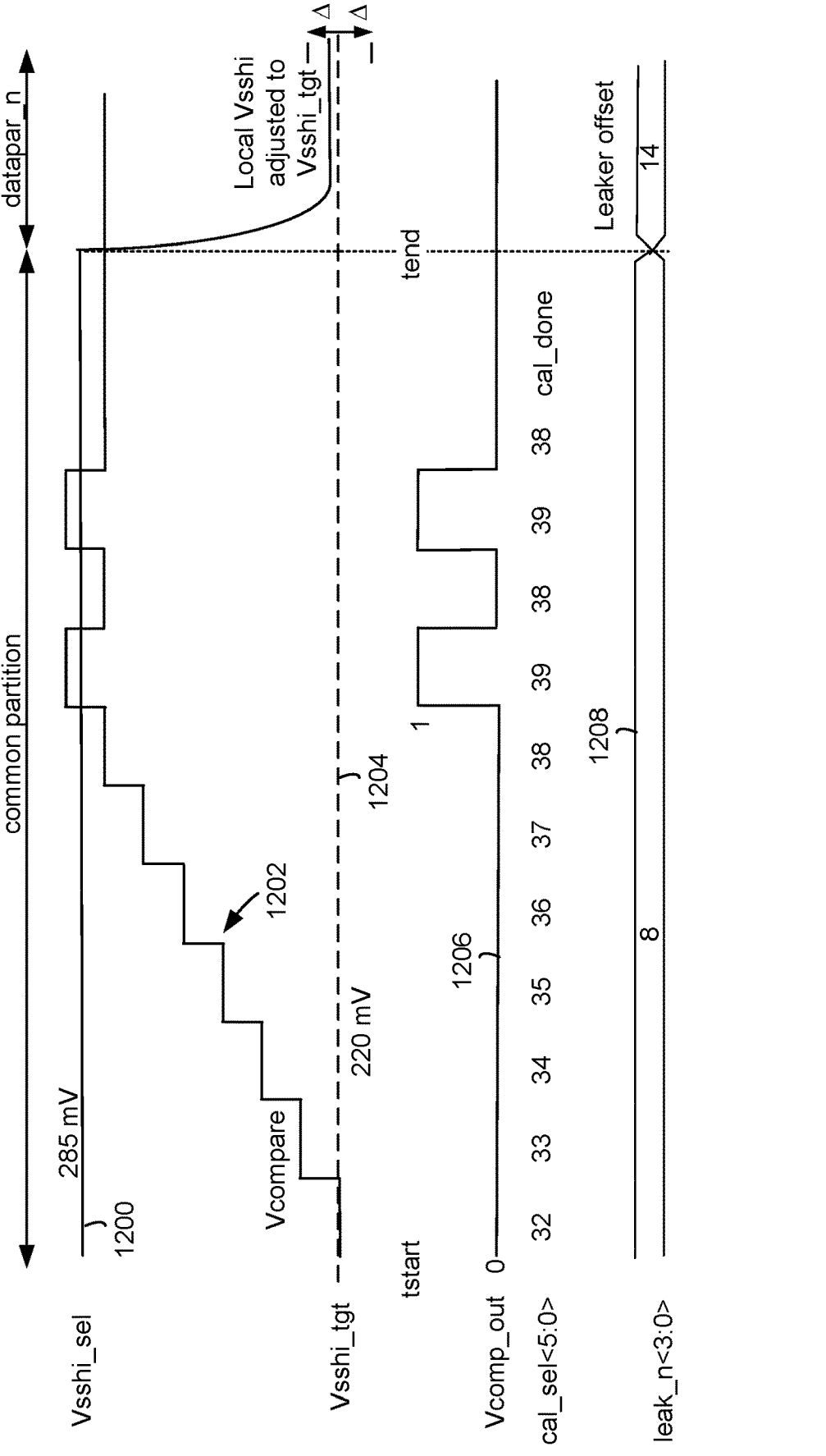

FIG. 12 depicts plots of example signals in the circuit portions 1000a and 1000b in FIGS. 10A and 10B, respectively, in a Vsshi compensation process, in accordance with various embodiments.

FIG. 13 depicts a flowchart of an example process for adjusting the leakage current in the leakage circuits 1030, 1036, 1038 and 1040 of FIG. 10A, in accordance with various embodiments.

Figure 14:
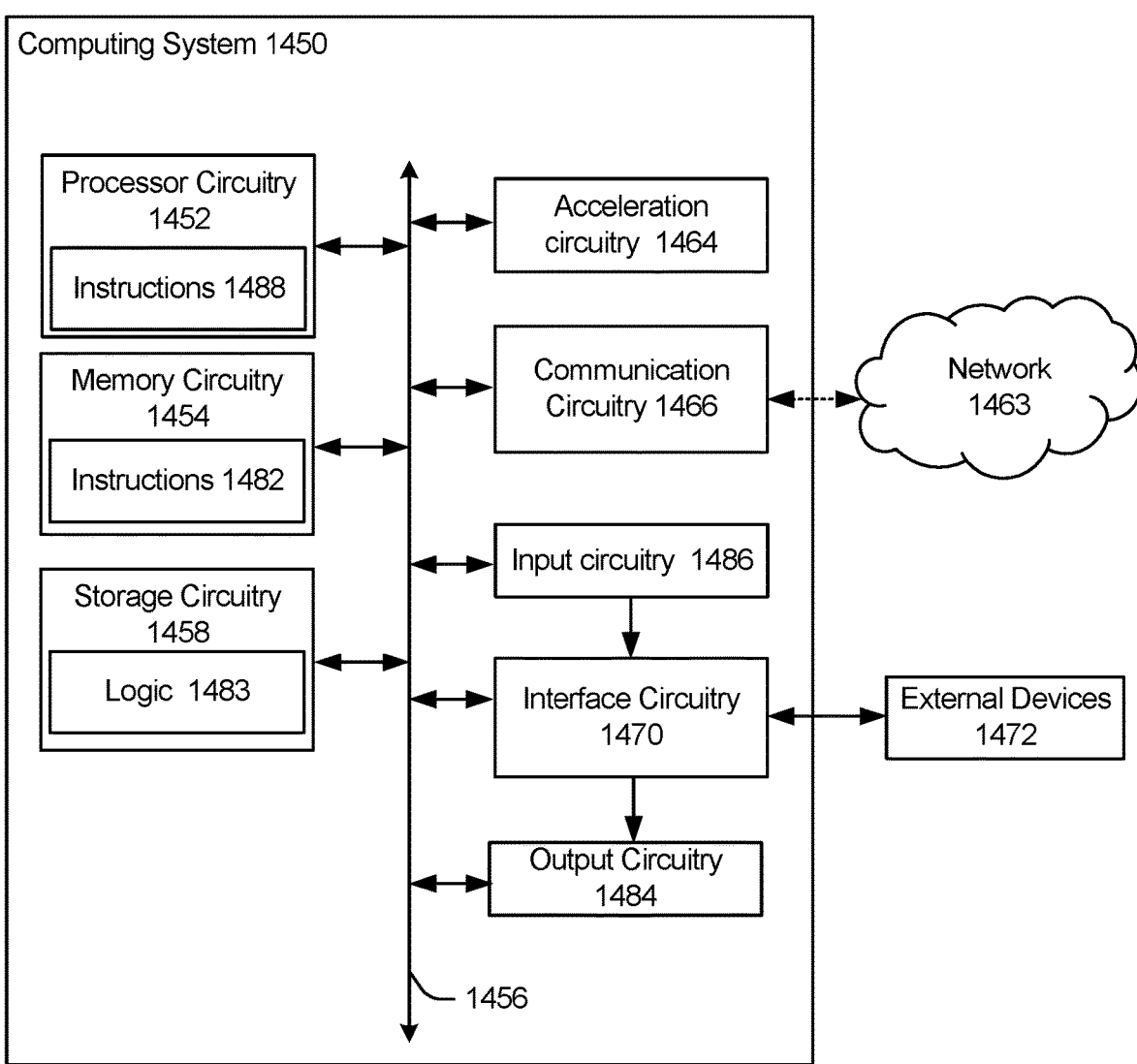

FIG. 14 illustrates an example of components that may be present in a computing system 1450 for implementing the techniques (e.g., operations, processes, methods, and methodologies) described herein.

DETAILED DESCRIPTION

As mentioned at the outset, various challenges are presented in supplying voltages to different partitions in a computing device such as a Double Data Rate (DDR) physical layer (PHY). For example, each partition may receive a supply voltage and a ground voltage. When the ground voltage is a positive voltage, referred to as Vsshi, the level can vary based on the position of the partition relative to a voltage source which provides the ground voltage. In particular, a current×resistance (I×R) voltage drop can vary based on the length and configuration of the path used to provide the ground voltages. This results in a location-based gradient in Vsshi. In an example implementation, the partitions include circuits for a Double Data Rate (DDR) memory.

The techniques and apparatuses provided herein address the above and other issues. In one aspect, a circuit is provided for evaluating the ground voltage of each circuit partition of a plurality of circuit partitions, one partition at a time. Once the ground voltage is determined, a corresponding code is stored for controlling a leakage circuit coupled to the ground node. The leakage circuit provides a leakage current based on the code to offset the ground voltage to a target voltage, which may be common for each of the partitions. The circuit can include a voltage source which supplies a stair step increasing voltage to a comparator. The comparator compares the voltage of the voltage source to the voltage of a ground node and provides an output which changes when the two input voltages are approximately equal, e.g., within a tolerance. The circuit may include a finite state machine for managing the process.

The techniques and apparatuses improve performance, including read timing margin, and longevity of the circuit partitions, as they can operate at an optimum and uniform voltage.

The above and other advantages will be further apparent in view of the following discussion.

Figure 1:
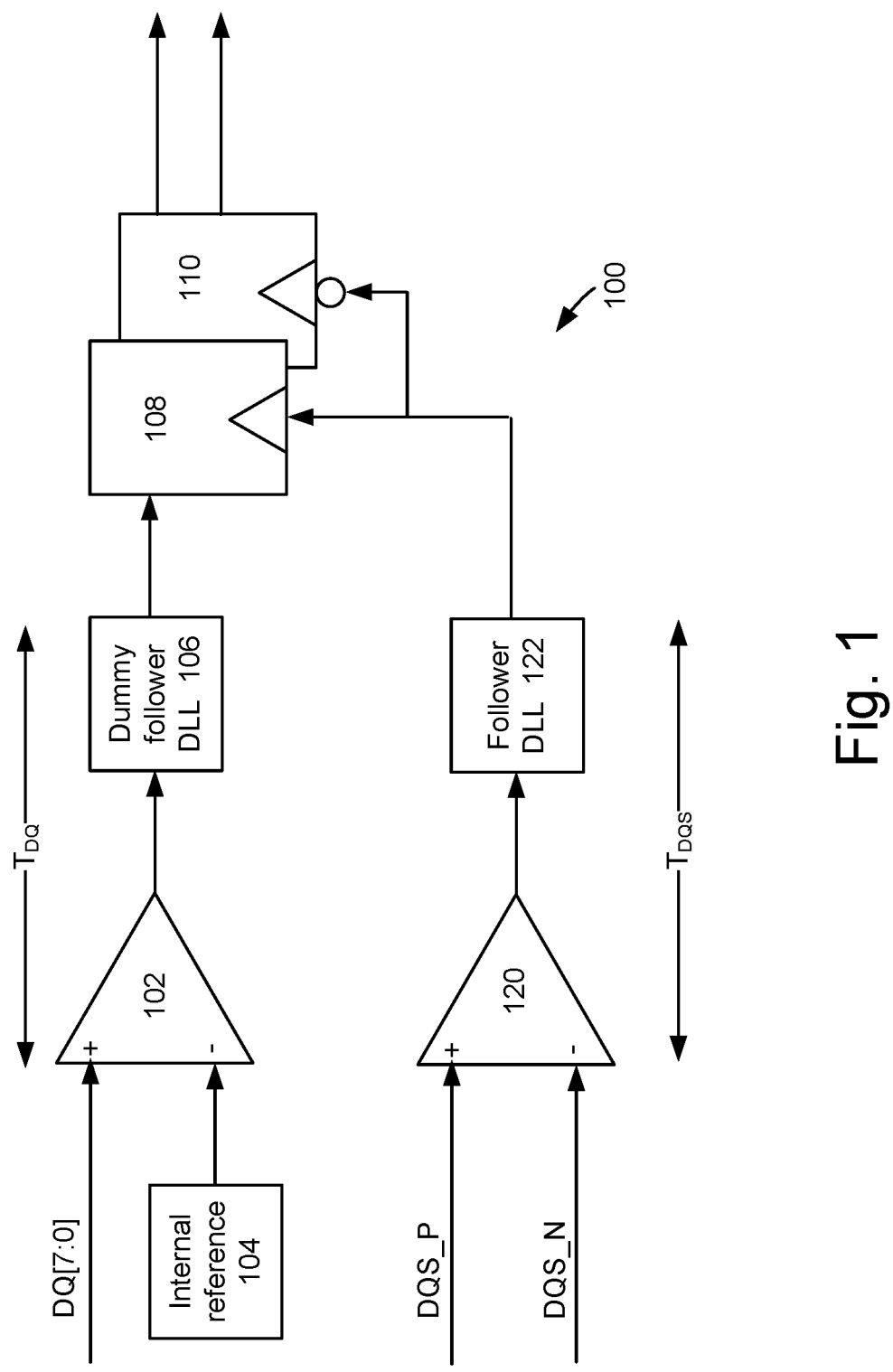
FIG. 1 depicts an example matched receiver 100, which is a type of circuit which may be in a memory DDR PHY data partition, in accordance with various embodiments.

FIG. 1 depicts an example matched receiver 100, which is a type of circuit which may be in a memory DDR PHY data partition, in accordance with various embodiments. This is a receiver architecture for a Double Data Rate 4 (DDR4) Synchronous Dynamic Random-Access Memory (SDRAM). The matched receiver includes first and second paths. In a first path, a continuous time amplifier receives a signal DQ[7:0] at a non-inverting input and a reference voltage from an internal reference 104 at an inverting input. An output of the amplifier 102 is provided to a dummy follower delay-locked loop (DLL) 106 which in turn provides a delayed output to latches 108 and 110. The DLL shifts DQS by 90 degrees to center DQS in the middle of the data eye to maximize the sampling window. The latches are controlled by a signal in a second path. When the signal is high, one of the latches is selected to provide a respective output and when the signal is low, the other latch is selected to provide a respective output. In the second path, an amplifier 120 receives a signal DQS_P at a non-inverting input and a signal DQS_N at an inverting input. An output of the amplifier 120 is provided to a follower DLL 122 which in turn provides a 90 degree phase shift delayed output to control the latches 108 and 110. Without accounting for the 90 degree phase shift from DLL 122, the time period TDQ=TDQS when there is a delay=0 between the DLL 106 and 122.

PHY can refer, e.g., to an electronic circuit, usually implemented as an integrated circuit, required to implement physical layer functions of the Open Systems Interconnection (OSI) model in a network interface controller. A PHY connects a link layer device (often called a medium access control or MAC) to a physical medium such as an optical fiber or copper cable. A PHY device typically includes both a physical coding sublayer (PCS) and a physical medium dependent (PMD) layer functionality. PHY may also be used as a suffix to form a short name referencing a specific physical layer protocol, for example M-PHY. Modular transceivers for fiber-optic communication (like the Small Form-factor Pluggable or SFP family) complement a PHY chip and form the Physical Medium Attachment or PMA sublayer.

Small Form-factor Pluggable (SFP) is a compact, hot-pluggable network interface module format used for both telecommunication and data communications applications. An SFP interface on networking hardware is a modular slot for a media-specific transceiver, such as for a fiber-optic cable or a copper cable.

Figure 2:
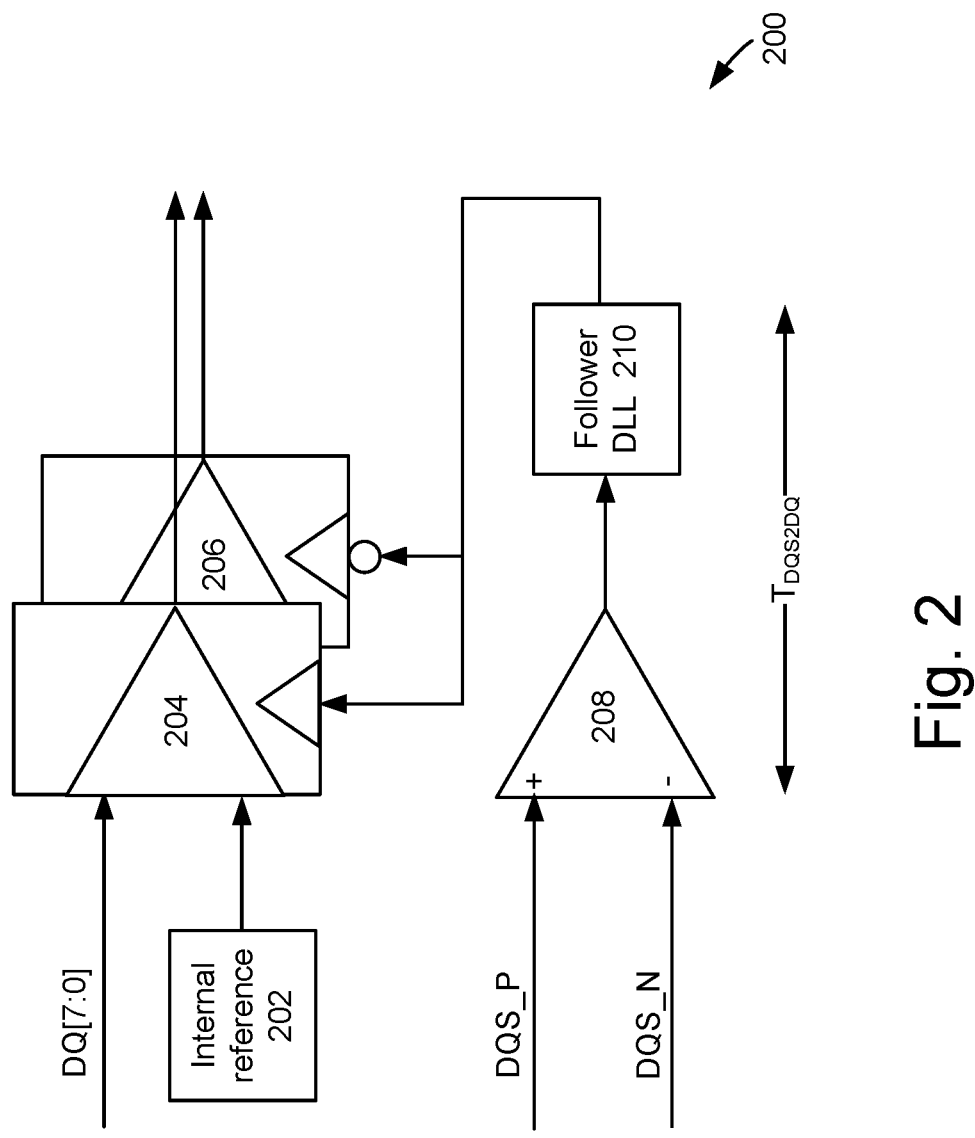
FIG. 2 depicts an example unmatched receiver 200, which is a type of circuit which may be in a partition, in accordance with various embodiments.

FIG. 2 depicts an example unmatched receiver 200, which is a type of circuit which may be in a partition, in accordance with various embodiments. This is a receiver architecture for a DDR5 SDRAM. The unmatched receiver includes first and second paths. In a first path, a signal DQ[7:0] and a reference voltage from an internal reference 202 are input to sampling amplifiers 204 and 206, each comprising an amplifier and a latch. The latches are controlled by a signal in a second path. When the signal is high, one of the latches is selected to provide a respective output fand when the signal is low, the other latch is selected to provide a respective output. In the second path, an amplifier 120 receives DQS_P at a non-inverting input and DQS_N at an inverting input. An output of the amplifier 208 is provided to a follower DLL 210 which in turn provides a 90 degree phase shift delayed output to control the sampling amplifiers 204 and 206. The time period $T_{DQS2DQ}$ represents a delay of the amplifier and follower DLL.

Some earlier designs of DDR5 PHY use an unmatched receiver (Rx) architecture with Decision Feedback Equalization (DFE)/strong arm latch for sampling the data at the DQ pad. The matched and unmatched Rx architecture for DDR4 and DDR5 are shown in FIGS. 1 and 2, respectively. The unmatched Rx path with the integration of DFE offers superior signal integrity performance at a higher bandwidth. The read strobe quality and compensation for the Rx strobe delay are important.

Figure 3A:
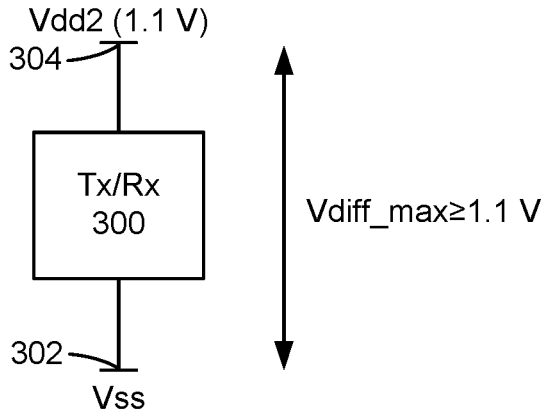
FIG. 3A depicts an example transmitter/receiver 300 with a ground node at Vss=0 V, which is a type of circuit which may be in a partition, in accordance with various embodiments.
Figure 3B:
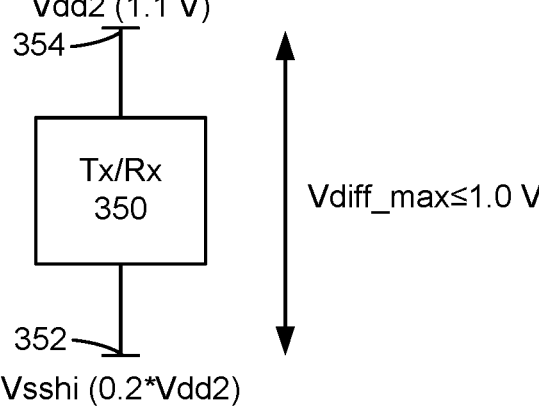
FIG. 3B depicts an example transmitter/receiver 350 with a ground node at Vsshi>0 V, which is a type of circuit which may be in a partition, in accordance with various embodiments.

FIG. 3A depicts an example transmitter/receiver 300 with a ground node at Vss=0 V, which is a type of circuit which may be in a partition, in accordance with various embodiments. A supply node 304 receives a voltage Vdd2 such as 1.1 V and the ground node 302 receives a voltage such as Vss=0 V. The maximum difference between the two nodes is Vdiff_max≥1.1 V FIG. 3B depicts an example transmitter/receiver 350 with a ground node at Vsshi>0 V, which is a type of circuit which may be in a partition, in accordance with various embodiments. A supply node 354 receives a voltage Vdd2 such as 1.1 V and the ground node 352 receives a voltage such as Vsshi=0.2*Vdd2. Thus, Vsshi is a positive voltage which is a predetermined fraction of the supply voltage. The maximum difference between the two nodes is Vdiff_max≤1.0 V. For example, 1.1-0.2×1.1=1.1−0.22=0.88 V.

The ground voltage can be an arbitrary reference point such that all other potentials in the circuit are measured relative to ground. The ground voltage can be 0 V or a positive voltage, Vsshi, for example. A positive round voltage is also referred to as an elevated ground voltage.

The voltages supplied to the circuit partitions should be carefully regulated to avoid electrical overstress (EOS). For example, the DDR5 Joint Electron Device Engineering Council (JEDEC) specification requirements for VDD2 and VDDQ for memory supplies has exceeded the transistor EOS limits in present and future deep sub-micron process nodes. The use of an elevated ground voltage, Vsshi, is required for the DDR4 and DDR5 input/output (IO) design to prevent reliability issues such as EOS and aging bias temperature instability (BTI). The Vsshi solution can be implemented across most of the DDR IO designs. In an example implementation, the Vsshi solution generates an elevated ground rail at a 0.2 ratio of the VDD2 supply.

As shown in FIG. 3B, the potential difference across the Tx/Rx 350 is always within the transistor EOS limits (e.g., EOS max limit=1.1 V) when the ground path is directly shorted to Vsshi (e.g., approximately 0.22 V) but not Vss (0 V).

However, in some DDR5 PHY designs, the Vsshi generator or voltage source is sitting in the middle (common partition) which is relatively far away (e.g., >4,500 μm) from the last data partition at the top and bottom of the PHY edges. See also FIG. 7. From a post silicon learning, there is >50 mV Vsshi gradient found in between common partitions versus the last data partition at the PHY edge due to the IR drop and the op amp feedback closed-loop sensing point being at the near end common partition. The localized IR drop at the data partitions causing the functional path is not working at the optimum level after taking the compensation value. The unmatched Rx path delay is sensitive to the potential difference across the logic gate along the Rx strobe path. The 50 mV delta on Vsshi causes more than ~10 psec. (picoseconds) inaccuracy from the Rx strobe delay compensation, which direct translates into a functional Rx timing margin loss. Moreover, the Vsshi gradient can contribute to an Rx test margin failure. The unmatched Rx with DFE is the most sensitive design to Vsshi offset in some DDR5

PHY designs. However, the Vsshi gradient concern is not limited to the Rx strobe delay, as other compensation blocks such as on-die termination (ODT) and resistance compensation (Rcomp) that sit inside the common partition may have problems as well. For example, this can be due to an impedance mismatch found between the compensation block and the Tx driver especially at slow p-type metal oxide semiconductor (PMOS) process-voltage-temperature (PVT) values.

Figures 4, 5:
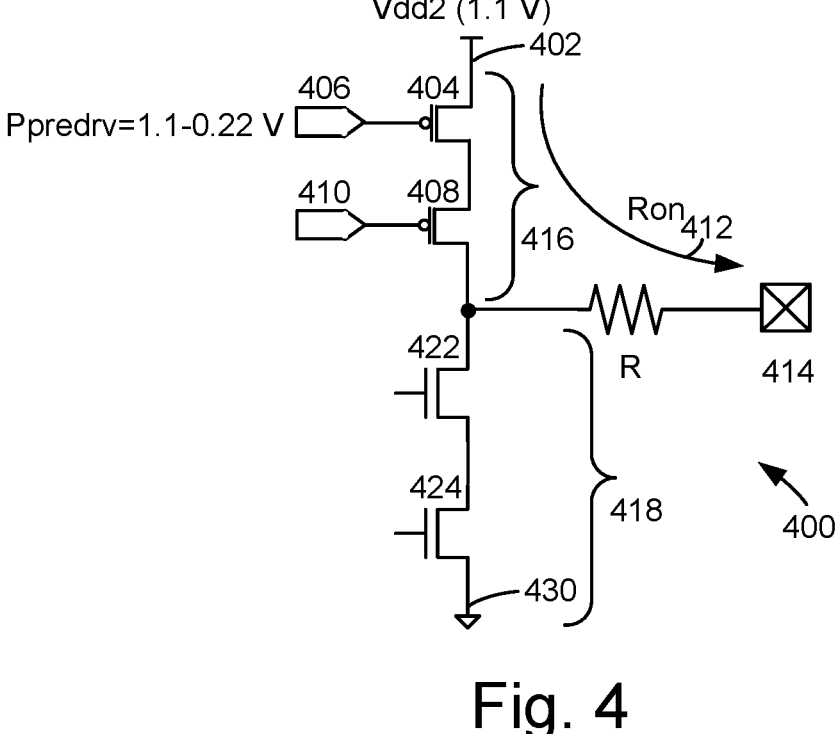
FIG. 4 depicts an example transmitter pull up/pull down circuit 400, which is a type of circuit which may be in a partition, in accordance with various embodiments.
FIG. 5 depicts a table showing changes in degradation of a circuit with and without Vsshi reliability protection, in accordance with various embodiments.

FIG. 4 depicts an example transmitter pull up/pull down circuit 400, which is a type of circuit which may be in a partition, in accordance with various embodiments. A simplified DDR5 pull up driver 416 is depicted having dependency on the Vsshi supply level. A 50 mV Vsshi offset between Rcomp and a Tx driver, or between the ODT and an Rx driver, would create an additional ~1-2 Ohm offset out of a 30 Ohm target.

The pull up circuit depicts pMOS transistors 404 and 408 in series with a pull down circuit 418 which includes nMOS transistors 422 and 424. A supply node 402 is at Vdd2=1.1 V and a ground node 430 is at 0 V. The control gate of the pMOS transistor 404 receives a voltage Ppredrv=1.1-0.22=0.88 V at a terminal 406. The control gate of the pMOS transistor 408 is coupled to a terminal 410 which is shorted to Vsshi. A resistor R is coupled at one side to a point between the transistors 408 and 422 and at the opposite side to a connector 414. A resistance Ron is created between the supply node 402 and the connector 414 as represented by an arrow 412.

FIG. 5 depicts a table showing changes in degradation of a circuit with and without Vsshi reliability protection, in accordance with various embodiments. Vsshi reliability protection techniques as described herein can reduce the potential different across the transistors and improve the reliability of the performance of a computing device. For example, in a DDR5 memory, read and write performance, and especially Tx/Rx timing, can be improved. The techniques are useful for future DDR5 products as well, for example, when the process technology reduces the transistor EOS limits. This reduction requires a higher Vsshi supply for reliability protection and to improve Tx and Rx performance, especially the unmatched Rx path delay.

The table depicts results of tests using two different VDD2 level shifter design architectures. The client DDR design includes Vsshi compensation for reliability protection, so that the output voltage swing is VDD2-Vsshi. In contrast, to meet a performance requirement, the server DDR has no active Vsshi compensation, so that the output voltage swing is VDD2-Vss. In a server DDR design, the weak local Vsshi is only activated during idle mode for EOS protection and defects per million (DPM) optimization. The results show that the client design with Vsshi compensation is successful in significantly reducing defects.

In particular, the first row indicates the percentage of circuits experiencing drain current (Id) degradation is x1% and x2% with and without Vsshi compensation, respectively. The second row indicates the percentage of circuits experiencing bias temperature instability (BTI) degradation is y1% and y2% with and without Vsshi compensation, respectively. The third row indicates the percentage of circuits experiencing hot carrier injection (HCI) degradation is z1% and z2% with and without Vsshi compensation, respectively. Vsshi compensation as described herein therefore significantly reduced degradation.

Figure 6:
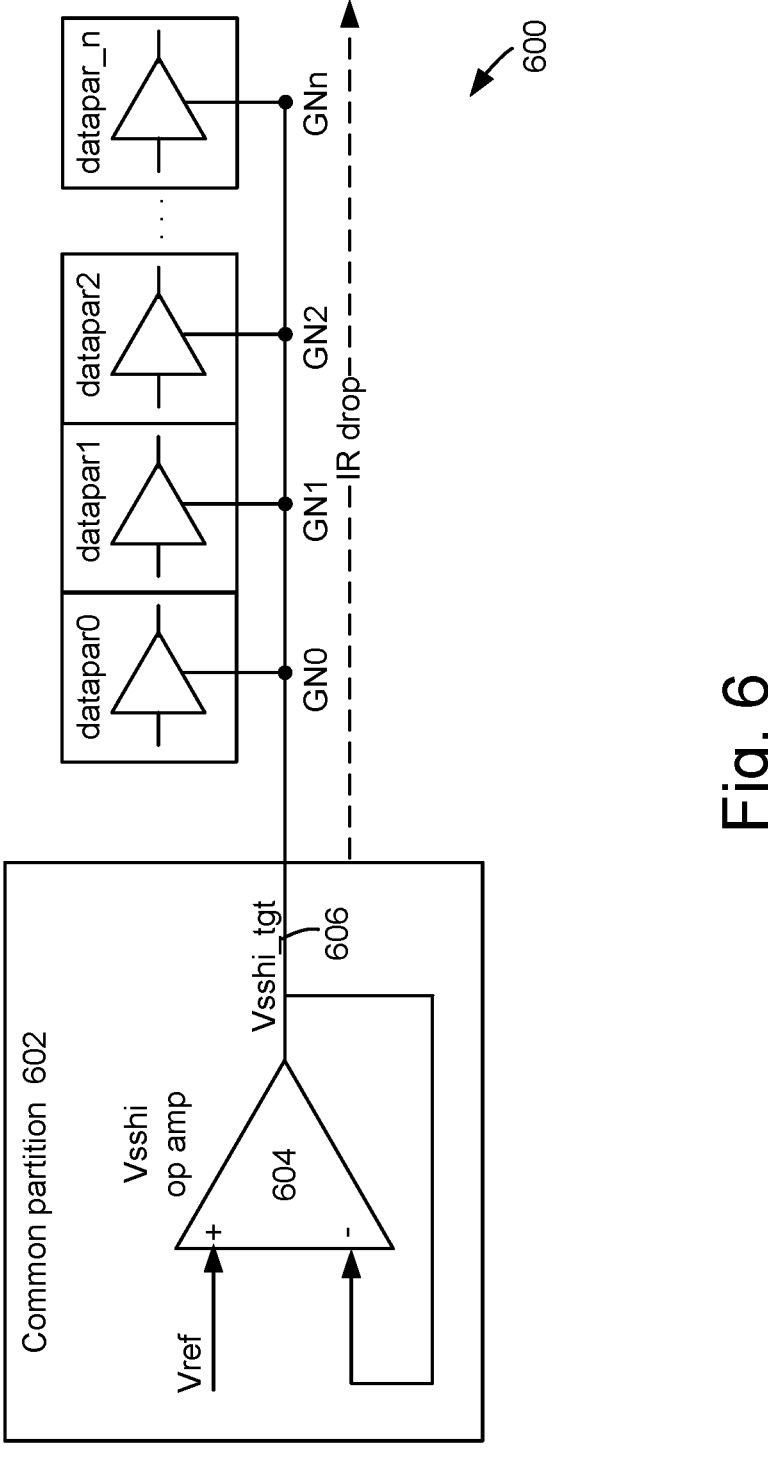
FIG. 6 depicts an example circuit 600 in which a target voltage Vsshi_tgt>0 V is provided to ground nodes of a number of data partitions, but separate regulation of each ground node voltage is not provided, in accordance with various embodiments.

FIG. 6 depicts an example circuit 600 in which a target voltage Vsshi_tgt>0 V is provided to ground nodes of a number of data partitions, but separate regulation of each ground node voltage is not provided, in accordance with various embodiments. The circuit is a comparative example to the circuit of FIGS. 10A and 10B. A common partition 602 includes an operational amplifier (op amp) 604. A non-inverting (+) input of the op amp receive a reference voltage, Vref, and an inverting input (−) of the op amp receives a feedback voltage, Vsshi_tgt, from the output of the op amp. Vsshi_tgt is a target or desired voltage for Vsshi. Vsshi_tgt is provided to a number of data partitions/circuit partitions datapar0, datapar1, datapar2, . . . datapar_n in a computing device (memory DDR PHY) via a path 606. Each data partition has a respective local ground node GN0, GN1, GN2, . . . , GNn, along the path. The voltage at each ground node can vary due to an IR drop, as mentioned, especially when a long routing is used for the path. The routing of the path can include one or more layers of a circuit including metal layers.

Generally, the Vsshi supply can be generated from two types of drivers: feedback and feedforward. A feedback driver compensates for low frequency noise in the system while a feedforward driver compensates for high frequency noise on the system. The feedback driver uses a class AB amplifier with the Vsshi target generated from a resistive digital-to-analog converter (RDAC). The feedforward system can include many distributed drivers that use switching capacitors to offset the dynamic current injected into the global Vsshi supply. The Vsshi reliability protection techniques provided herein can be implemented at the common partition with the near end op-amp output voltage directly returned through a feedback loop. Any compensation scheme (e.g., op-amp offset calibration) added on top of the Vsshi design can only reduce the Vsshi error at the common partition area. The far end Vsshi IR drop due to the long routing of the path 606 near the data partition, e.g., datapar_n is not able to be corrected by the feedforward leakage circuit used for cancelling alternating current (AC) current injection.

The Vsshi op amp 604 can be a unity gain feedback op amp that maintains a direct current (DC) value of the Vsshi at its output. This global DC Vsshi value is distributed to all the Vsshi consumers in the different partitions, mainly Tx and Rx circuitry, in some implementations.

FIG. 6 shows a high level Vsshi system with the feedback op amp sitting in the middle of the PHY and its output distributed to the data/CCC (Clock/Control/Command) partitions. A CCC partition is a partition to send an instruction to the DRAM to start a certain operation such as read/write.

Figure 7:
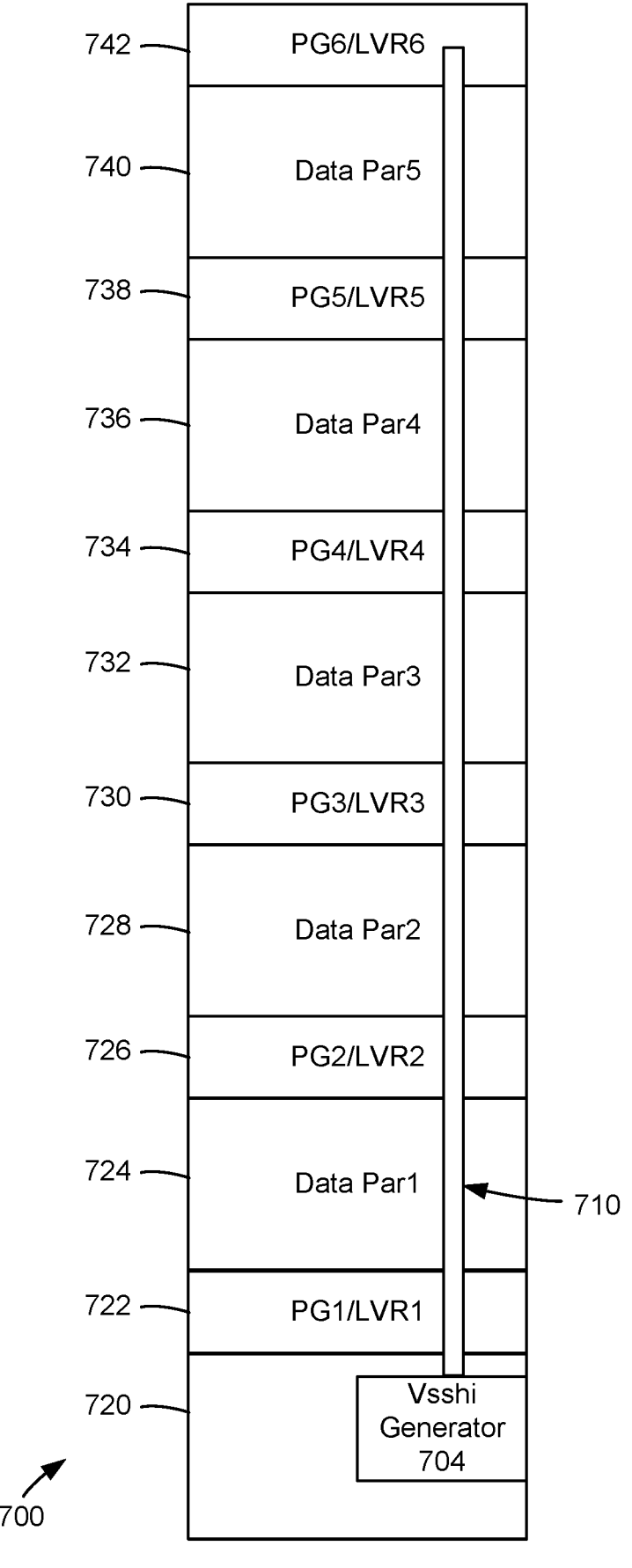
FIG. 7 depicts an example physical (PHY) floorplan 700 of partitions of a computing device with a Vsshi generator 704 in a common partition 720, in accordance with various embodiments.

FIG. 7 depicts an example physical (PHY) floorplan 700 of partitions of a computing device with a Vsshi generator 704 in a common partition 720, in accordance with various embodiments. An example Double Data Rate (DDR5) floorplan is depicted. Generally, a DDR PHY design has different functional blocks, also referred to as partitions. Each partition will have own function to perform simultaneously to cause the memory DDR PHY to operate in read/write or idle mode. Additionally, each data partition will have two bytes of DQ data bits (2×8 bits DQ) and each byte will have one DQS (strobe), for example. Each DQ will have transmitter and receiver to perform write/read operations, respectively. DQS is like a synchronous clock source and is used to synchronize the sampling of the DQ signals, which are sampled on both the rising and falling edges of the strobe.

A Vsshi generator 704 outputs a global Vsshi supply for distribution on a path 710. The path can include a top metal layer TM1 across the CCC and data partitions over a relatively long distance such as >4500 μm. The op amp closed-loop feedback is designed at the near end common partition which does not encounter the same DC IR drop compared to the outer data partitions due to different leakages.

The Vsshi generator 704 is in a compensation block 720, also referred to as a near end common or compensation partition. The compensation partition can include various compensation blocks such as driver impendence compensation, delay compensation and some other circuits such as the Vsshi generator 704 just is generated in this common block and distributed through the wide metal layer of path 710 to all the data partitions and CCC partition. The compensation blocks are basically a replica circuit from the data partition and the common results from the compensation partition will send to all the data partitions during functional operations such as read/write mode.

A block 722 represents power gates PG1 and linear voltage regulators LVR1. A block 724 represents a first data partition, Data Par1. A block 726 represents power gates PG2 and linear voltage regulators LVR2. A block 728 represents a second data partition, Data Par2. A block 730 represents power gates PG3 and linear voltage regulators LVR3. A block 732 represents a third data partition, Data Par3. A block 734 represents power gates PG4 and linear voltage regulators LVR4. A block 736 represents a fourth data partition, Data Par4. A block 738 represents power gates PG5 and linear voltage regulators LVR5. A block 740 represents a fifth data partition, Data Par5. A final block 742 represents power gates PG6 and linear voltage regulators LVR6.

The Power Gate/Voltage Regulator partitions 722, 726, 730, 734, 738 and 742 include all the power supply generators.

This example thus includes five data partitions. Generally, one or more data partitions can be provided.

Figure 8:
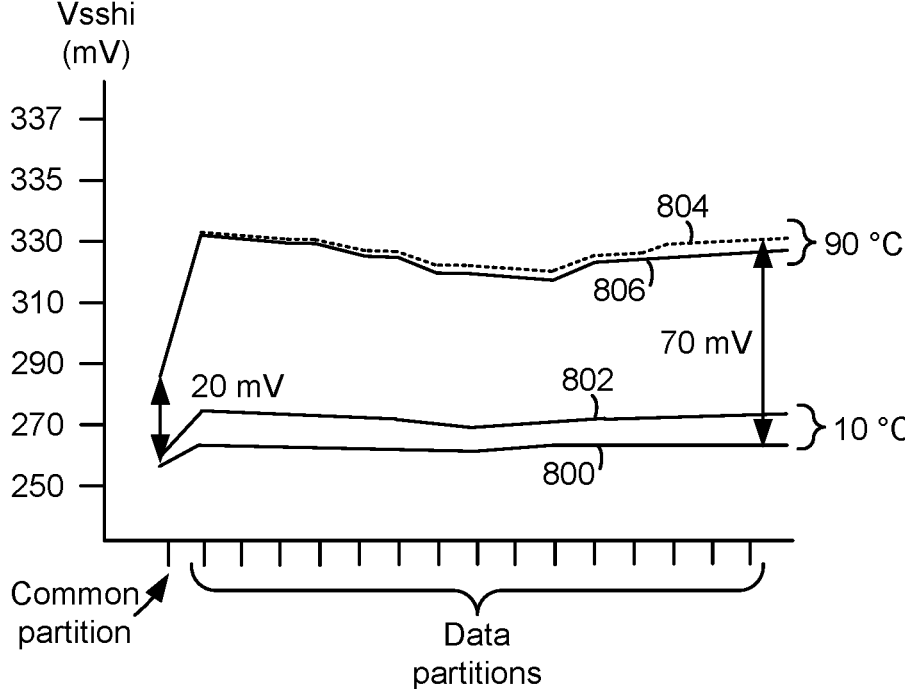
FIG. 8 depicts example plots of voltage versus common/multiple data partitions, for different temperatures and different amounts of traffic, in accordance with various embodiments.

FIG. 8 depicts example plots of voltage versus common/multiple data partitions, for different temperatures and different amounts of traffic, in accordance with various embodiments. On the horizontal axis, the first hash mark is for the common or compensation partition 720 in FIG. 7 and the other hash marks are for the data partitions. Plots 800 and 802 represent a default (idle) state and an active, high traffic state, respectively, with a relatively low temperature of 10 C. Plots 804 and 806 represent a default (idle) state and an active, high traffic state, respectively, with a relatively high temperature of 90 C.

Because the Vsshi generator 704 is located in the compensation partition, the voltage delta at 10 C and 90 C is tracking pretty well. A 20 mV offset was observed while for the data partitions (datapar1, datapar2, . . . datapar_n) that sit further from the common partition, a significant Vsshi delta (~70 mV) was observed at different temperatures. The effective delta of Vsshi from the common partition to data partitions is 70 mV−20 mV=50 mV.

The plots represent Vsshi performance from post-silicon data. By comparing with the Vsshi target at 250 mV, for example, the Vsshi offset due to IR drop effects is less sensitive to the PHY activity, default (idle) vs. traffic. However, the IR drop or Vsshi shift is significant when there is a temperature drift, from 10 C to 90 C, where more current is injected. The worst-case DC level drift is >50 mV between common and data partitions. For example, a 70 mV difference is seen between the plots 800 and 804 in the data partition while only 20 mV is found in the common partition. The replica Rx strobe delay path in the compensation block (comp.) sees a lower Vsshi drift (~20 mV) compared to the functional Rx path at the data partition (~70 mV). It is ~50 mV delta from 10 C to 90 C temperature drift. From circuit simulation results, the ~50 mV Vsshi drift would introduce ~10 psec. Rx margin loss. With the combination of other factors, the failure of the test in read timing margin has driven the DDR5 Rx architecture from the unmatched Rx architecture to the matched Rx architecture.

Accordingly, Vsshi can vary across partitions and based on temperature and amount of traffic when compensation is not used.

FIG. 9A depicts example plots of read timing margin (left side eye) across multiple data partitions, for different temperatures, in accordance with various embodiments. This is based on the left side of an eye diagram which is a tool used to show the transmission quality of digital signals. On the vertical axis, the read timing margin ranges from 0-80 psec., where a higher read timing margin is preferred. A target level is depicted for the read timing margin. This target could represent a number of defective parts per million, for example. The dotted vertical lines represent the case of a matched Rx and the solid vertical lines represent the case of an unmatched Rx. As mentioned, the unmatched Rx is more sensitive to changes in Vsshi. The horizontal axis depicts different combinations of boot temperature and run temperature. The case of a boot temp.=10 C and run temp.=90 C results in the read timing margin falling below the target for the unmatched Rx. All other cases have a read timing margin above the target. Boot refers to the boot up process of a computing device such as a PC or server. In a computing device, booting is the process of starting a computer as initiated via hardware such as a button or by a software command. After it is switched on, a computer's central processing unit (CPU) has no software in its main memory, so some process must load software into memory before it can be executed. This may be done by hardware or firmware in the CPU, or by a separate processor in the computer system. Run refers to the operation of the computing system after it is booted.

FIG. 9B depicts example plots of read timing margin (right side eye) across multiple data partitions, for different temperatures, in accordance with various embodiments. The vertical and horizontal axes are the same as in FIG. 9A. The case of a boot temp.=90 C and run temp.=10 C results in the read timing margin falling below the target for the unmatched Rx. All other cases have a read timing margin above the target.

Generally, the matched Rx has little or no Vsshi dependency, and it can support up to 4800 mega transfers/second (MT/sec.), where a mega transfer refers to one million transfers, while meeting System on a Chip (SoC) read timing margin targets. However, when the product requires higher bandwidth support, the unmatched Rx with DFE is a superior architecture.

The unmatched design results in larger variations in the read timing margin due in part to Vsshi variations. The unmatched Rx path with the integration of DFE offers superior signal integrity performance at higher bandwidth (e.g. 6400 MT/sec.) and is typically required when the DDR bandwidth is increased beyond 4800 MT/sec. The comparative Vsshi design concept of FIG. 6 does not include separate compensation of partition ground node voltage. It sends one common source to the entire PHY, resulting in the local Vsshi drift as shown in FIG. 8, and is not able to support future memory bandwidth needs. Vsshi accuracy across the data partitions is important for DDR5 and beyond and for other types of circuits.

The techniques disclosed herein address these issues by providing local calibration of Vsshi at each partition to improve the Vsshi accuracy within each data partition, and to provide a uniform Vsshi for all data partitions.

FIG. 10A depicts a circuit portion 1000*a* for regulating ground node voltages of data partitions, in accordance with various embodiments. Each data partition, also referred to as a circuit partition, can represent a functional block in an overall circuit or system. The system can be partitioned to allow it to be more efficiently managed. The circuit portion 1000*a* is combined with the circuit portion 1000*b* of FIG. 10B to form an overall circuit or system.

The system can detect the local Vsshi at each data partition and determine and apply a dedicated offset locally to equalize the final Vsshi at each partition, to provide all ground node voltages closer to the final Vsshi target. The system thus compensates the local ground node voltage of each partition to adjust the voltage of each ground node to a uniform target voltage. The system achieves a precise Vsshi for each partition for both the compensation blocks (replica design) in the common partition and the functional Tx/Rx path at the data/CCC partitions. This improve performance, e.g., by reducing read/write margin loss. In one approach, the offsets are determined before a memory reference code (MRC) training memory in the device which includes the partitions. On Intel platforms, in the Basic Input-Output System (BIOS), Memory Reference Code (MRC) training refers to, e.g., initializing the memory controller and optimizing read/write timing and voltage for optimal performance.

Moreover, periodic calibration can be done after MRC training to re-determine the offsets. This can further reduce the Vsshi gradient due to temperature and voltage drift and keep the MRC trained setting always optimum across the temperature and voltage drifts. Further, the calibration can be performed separately for different operating modes of the partitions, including idle, read and write.

The techniques provide a number of advantages. For example, with process scaling, the transistor EOS limits is continually reduced, e.g., from 1.08 V to ~0.9 V (future trends). The JEDEC DDR5 specification fixes the supply at 1.1 V, typically. The elevated ground reference supply, Vsshi, which is used for EOS protection therefore becomes a desired feature for DDR5 IO design in all future client and server products. Any Vsshi offset between the compensation blocks and the actual Tx/Rx functional path would increase the margin loss in the memory read/write mode, especially when DDR5 is required to support 6400 to 8400 MT/sec. in future client products. The same techniques can be used in server DDR5 designs as well. Reducing the Vsshi gradient helps to buy back significant margin from the unmatched Rx architecture for DDR5 PHY in future designs. The same techniques can expand to the Low-Power (LP) DDR5 PHY (VDD2=1.05 V) when the process technology has scaled the EOS limits to 0.9 V or below.

The circuit portion 1000*a* of FIG. 10A includes a leakage circuit for the ground node of each data partition. For example, data partitions datapar0-datapar3 have ground nodes GN0-GN3, respectively, coupled to a path 1014. Leakage circuits 1030, 1036, 1038 and 1040 are coupled to ground nodes GN0, GN1, GN2 and GN3, respectively. Each leakage circuit is responsive to a leakage code which can be provided by a finite state machine (FSM) 1070 (FIG. 10B) or other processor or controller. The leakage circuit generates a leakage current which reduces the local Vsshi of the ground nodes to a uniform target level, Vsshi_tgt, e.g., +/−a tolerance such as no more than +/−5% of Vsshi_tgt. By removing charge from a ground node, the voltage of the ground node decreases.

Each partition can include circuit components. For example, datapar0 depicts an example circuit component 1016.

In an example implementation, each leakage circuit includes two nMOS transistors, where the first nMOS transistor has its drain coupled to the ground node (GN0) and the other nMOS transistor has its source coupled to ground (0 V). The first nMOS can also have its drain connected to its control gate to form a two-terminal device, a diode-connected transistor, which acts like an active load. The second nMOS transistor can be adjusted based on the leakage code to adjust the amount of current leakage. In one approach, a digital-to-analog convertor (DAC) outputs a control gate voltage for a control gate of the second transistor. A higher control gate voltage makes the transistor more conductive resulting in a large leakage current. The DAC is responsive to the leakage code to convert the code into a control gate voltage.

For example, the leakage circuits 1030, 1036, 1038 and 1040 include DACs 1033, 1037, 1039 and 1041, respectively, which are responsive to leakage codes leak0<3:0>, leak1<3:0>, leak2<3:0> and leak3<3:0>, respectively. Each leakage code can have four bits, as an example. The leakage circuit 1030 includes a first nMOS transistor 1032 and a second nMOS transistor 1034. Other types of transistors such as pMOS could be used. Other implementations of the leakage circuit could also be used.

Each ground node GN0, GN1, GN2 and GN3 is coupled to a multiplexer 1042 (e.g., at numbered inputs 1-4) via a path 1018, 1020, 1022 and 1024, respectively, which carry ground node voltages Vsshi0, Vsshi1, Vsshi2 and Vsshi3, respectively. An additional input (number 0) receives Vsshi_tgt. Based on a partition select signal, Vsshi_par_sel, from the FSM, the multiplexer passes one of the input voltages as Vsshi_sel on a path 1044 to an inverting input (−) of a comparator 1046. A comparison voltage, Vcompare, provided by the FSM, is input on a path 1050 to a non-inverting input (+) of the comparator. An output of the comparator, Vcomp_out, on a path 1048, is 0 when Vsshi_sel>Vcompare and 1 when Vsshi_sel≤Vcompare. Vcomp_out is provided as an input to the FSM as a 0 or 1.

The target voltage, Vsshi_tgt, on the path 1014 is output on a path 1010 from an op amp 1006. The op amp receives a voltage Vtgt at a non-inverting input on a path 1004 and Vsshi_tgt as a feedback signal on a path 1008 at an inverting input of the op amp. Vtgt is output from a multiplexer 1002 which passes a voltage from a resistive DAC, RDAC1, based on a select signal, sel, from the FSM. RDAC1 receives Vdd at a power supply node and 0 V at a ground node. RDAC1 can be considered to be a voltage source which provides Vtgt. A leakage circuit 1012 can optionally be provided to reduce Vsshi_tgt in response to a code, leak_tgt, from the FSM. The leakage circuit 1012 can be configured similarly to the leakage circuits 1030, 1036, 1038 and 1040. The RDAC1, op amp 1006 and leakage circuit 1012 can be part of a voltage source which provides Vsshi_tgt.

By selecting one of the elevated ground voltages at a time using the multiplexer 1042, and comparing the selected ground voltage to different comparison voltages, Vcompare, the level of the selected ground voltage can be determined. In response, a leakage current of the respective leakage circuit can be set to adjust the ground voltage from its current level, which is higher than desired, back down to the target level of Vsshi_tgt. The target node voltage, Vsshi_tgt, can also be evaluated at the comparator to ensure it is accurate using the same circuitry which evaluates the selected ground voltages.

FIG. 10B depicts a circuit portion 1000*b* for regulating ground node voltages of data partitions, together with the circuit portion 1000*a* of FIG. 10A, in accordance with various embodiments. The FSM 1070 receives Vcomp_out as an input and provides a number of outputs.

Generally, a FSM is an abstract machine that can be in exactly one of a finite number of states at any given time. The FSM can transition from one state to another in response to specified inputs. An FSM may be defined by a list of its states, its initial state, and the inputs that trigger each transition.

An output sel is a select signal for the multiplexer 1002 of FIG. 10A. An output signal Vsshi_par_sel is a select signal for the multiplexer 1046. The output code leak_tgt is a code to set a leakage current of the leakage circuit 1012. The output leakage code leak0<3:0>, leak1<3:0>, leak2<3:0> and leak3<3:0> are used to set a leakage of the leakage circuits 1030, 1036, 1038 and 1040, respectively. Additionally, separate leakage codes can be provided for different modes or states of the partitions, such as idle, read and write. For example, leak0<3:0>_Idle, leak0<3:0>_Read and leak0<3:0>_Write can be provided for idle, read and write modes, respectively, for the leakage circuit 1030. Similar codes can be provided for the other partitions.

An additional output of the FSM is a select signal cal_sel<5:0>, which may be six bits, for example, for a multiplexer 1072, which passes a corresponding voltage from a resistive DAC, RDAC2. RDAC2 receives Vdd at a power supply node and 0 V at a ground node. An output of the multiplexer is Vcompare on the path 1050 which is coupled to the non-inverting input of the comparator 1046. RDAC2 and the multiplexer 1072 can be considered to form a voltage reference source which provides Vcompare.

One goal of the circuit of FIGS. 10A and 10B is to provide a uniform Vsshi voltage level across entire DDR PHY and make read/write margin insensitive to the Vsshi design.

In a memory subsystem design, MRC training may need to be executed during boot time. Additional steps are required to slot in as part of the MRC training algorithm right before the original read/write margin training. These additional steps are expected to require only about 10-20 μsec., which is negligible for the entire MRC training latency that usually requires up to few tenths of a second. In summary, the same MRC idle/read/write margin training can be executed twice now. The steps below can be followed:

1) MRC enabled normal idle/read/write mode training per data partition basis. A local Vsshi noise and IR drop are generated at each data partition with actual Idle/Read/Write link activity. Local Vsshi calibration is running with actual Vsshi noise injection per data partition per traffic types.
2) Normal MRC idle/read/write margin training run with precise Vsshi across all the data partitions.
3) Periodic calibration for reducing temperature and voltage drift effects During Vsshi calibration (Step 1), each data partition can operate in idle, read and write modes to mimic and generate the actual noise and IR drop behavior locally. Although each data partition design is modular and reuse only, there may be some top-level metal layer layout routing mismatch at the family level. The calibration shall perform at idle, read and write mode per data partition basis. Alternatively, to save the FSM run time, the designer can just calibrate the local Vsshi at one data partition and apply a static offset code on top of the calibrated code to each data partition to cancel out the systematic offset from one partition to another partition. For example, the voltage of GN0, which is closest to the voltage source for Vsshi_tgt, can be determined to set a corresponding leakage current. The voltages of GN1, GN2 and GN3 can be assumed to be equal to the voltage of GN0+Δ, GN0+2Δ and GN0+3Δ, respectively, for example. The leakage currents for GN1, GN2 and GN3 can then be set accordingly. In another option, the voltage of GN3, which is furthest from the voltage source for Vsshi_tgt, can be determined, and the voltages of the other ground nodes can be estimated such as by extrapolation.

Another option is to determine the voltage of two or more ground nodes and estimate the voltage of one or more other remaining ground nodes. For example, the voltages of GN0 and Gn2 can be determined and extrapolated to GN1 and GN3. The voltage of GN1 may be the average of the voltages of GN0 and GN2. Although, determining the voltage of each ground node separately provides the greatest accuracy.

In an example implementation, a ground node is among multiple ground nodes; each ground node is associated with a respective circuit partition and a respective leakage circuit; a circuit is to detect voltages of a subset of the multiple ground nodes and, based on the detected voltages, determine leakage settings of the respective leakage circuits; and the circuit is to estimate a leakage setting for leakage circuits of one or more other ground nodes based on the determined leakage settings.

The FSM can provide dedicated registers 1074 for each data partition to store all the calibrated information at the idle, read and write mode (e.g., leak0<3:0>_Idle, leak0<3:0>_Read, leak0<3:0>_Write).

After all the local Vsshi voltage levels are digitized at each data partition per link traffic types, the FSM should start to perform a lookup table (LUT) mapping and propagate the final leakage code setting to each data partition to re-adjust the local Vsshi near to the final global Vsshi target with respect to the link traffic types. It is desirable to calibrate the Vsshi based on three different modes (idle, read and write) as the dynamic current going in to/out of the Vsshi nodes are very different. Some data partitions may be unused or in different active states. Calibrating the data partition based on dedicated traffic types ensures the local Vsshi performs at the optimum level at all times. Each calibrated code will ensure the local Vsshi settles to the same level.

The end goal for this idea is to create a precise Vsshi across the entire PHY especially from compensation block to functional data path. The designer can perform dynamic code switching with respect to the idle/read/write traffic at each data partition. The number of leaker legs to be turned on is based on the data partition traffic types. This is similar to switching an Rcomp code for an output driver for Tx versus ODT for a Rx. In most cases, read/write will space out by a few CLK cycles timing latency. The main purpose of Step 1 is to fine tuning the local Vsshi to the optimum level with respect to the idle/read/write traffic. Subsequently, the MRC can repeat the standard read/write margin training (Step 2) with a precise Vsshi level across all the data partitions to obtain the final and optimum read/write configuration registers setting for the PHY. During MRC training, each data partition may have different traffic types with the dedicated leaker code mapping which ensures the local Vsshi is always regulated to the precise level locally. The MRC training during boot can continue to apply a few code offsets on top of the calibrated value in each dedicated data partition in order to further optimize the read/write margin. This will further reduce the residual error due to this calibration scheme. The residual error may be due to the long feedback routing losses. However, ideally a complementary metal-oxide-semiconductor (CMOS) process has negligible gate leakage, which may not create a significant IR drop. Routing a global reference voltage with proper shielding across a PHY design can be done.

The same Step 1 FSM algorithm and infrastructure can be used for periodic calibration (Step 3). Step 3 is used to further reduce the temperature and voltage (VT) drift effects on the Vsshi system. This is expected to involve just a few codes changes as the Vsshi across the PHY after MRC training should already be at an optimum level and any new IR drop or noise due to the VT drift may likely be tracking and happening in the same direction for each data partition.

The periodic Vsshi calibration can be done and the calibrated code will be only latched in to the local Vsshi leakage circuit during the next similar traffic window. For example, when the new Vsshi calibration is done at the data partition operating in read mode, the leaker code will only updated and used for the next read mode for this specific data partition. In practice, a temperature change of 1 C can occur in about one second, so that there is plenty of time window for the calibrated code based on the current traffic to be updated and used for the next similar traffic type. Ideally, the feedback output Vsshi_sel is close to Vsshi_tgt, which derived from RDAC1. To obtain a high accuracy design, the designer can optionally also consider adding additional leaker legs at the near end Vsshi generator output with the additional Vsshi calibration for Step 1 (other than each data partition) done based on the Tx/Rx compensation scheme activity. These leaker legs are denoted by the leakage circuit 1012.

The detail calibration flow in Step 1 will be discussed here. Firstly, the calibration should be started with the "Vsshi_par_sel"=0 to select the near end feedback Vsshi_tgt. The first step of the calibration is used to obtain the input offset (Voff) from the op amp feedback design, it can be a positive (Vsshi_tgt+$\Delta$) or a negative (Vsshi nom-$\Delta$) offset as depicted in FIG. 12. Then, the idea described here will start to digitize the local Vsshi at each data partition (e.g., Vsshi0, Vsshi1, Vsshi2, Vsshi3). At each data partition, the MRC will trigger different traffic types such idle, read and write mode for local Vsshi calibration purposes. At each calibration stage, the selected local Vsshi will act as reference (Vsshi_sel) for the comparator. Subsequently, the FSM will sweep the RDAC2 code up/down depending on the Vcomp_out state. The local Vsshi digitization process is discussed further below in connection with FIG. 12.

FIG. 11 depicts an example table of codes for adjusting the leakage current in the leakage circuits 1030, 1036, 1038 and 1040 of FIG. 10A, in accordance with various embodiments. The first column depicts different values of cal_sel<5:0>. For each value of cal_sel<5:0>, a corresponding value of Voffset is output, where Voffset=Vsshi_sel-Vsshi_tgt. In this example, Voffset is changed by 10 mV for each single bit change in the code. Voffset ranges from 70 mV to −70 mV in 10 mV increments in this example. Also, for each value of cal_sel<5:0> and Voffset, there is a respective code, leak_n<3:0>, which can correspond to any of leak0<3:0>, leak1<3:0>, leak2<3:0> and leak3<3:0>, for example. Other implementations of the table could be provided. For example, the increments in Voffset (and thus Vcompare) could be unequal.

The dedicated leakage circuit for each partition can be designed to offset the local Vsshi separately for each data partition (or per byte) per traffic type. The leakage current strength can be designed to cover a positive and negative Vsshi offset range. The example of the LUT for the Voffset versus leaker strength is shown in FIG. 11.

FIG. 11 shows the final calibration results where the calibration is done at RDAC2 code=38, by mapping to the LUT, the optimum value of leak_n<3:0> setting will be code=14. When the datapar_n leakage circuit is programmed to code 14, Vsshi_n will be pulled down closer to the final global Vsshi target. The example here assumes the design can tolerate a ~5 mV residual Vsshi offset. The designer can further reduce the step size of the RDAC2 and increase the number of leaker legs per leakage circuit to obtain a finer granularity. This example further assumes the op amp is ideal with Voff=0.

FIG. 12 depicts plots of example signals in the circuit portions 1000*a* and 1000*b* in FIGS. 10A and 10B, respectively, in a Vsshi compensation process, in accordance with various embodiments. A plot 1204 depicts an example level of Vsshi_tgt as 220 mV. A plot 1202 depicts Vcompare as it increases in steps, starting from the level of Vsshi_tgt. The signal cal_sel<5:0> also increases in increments as Vcompare increases. After seven step increases of 10 mV each, Vcompare reaches 290 mV and exceeds Vsshi_sel, which is 285 mV in this example. In response to Vcompare exceeding Vsshi_sel, plot 1206 indicates that Vcomp_out changes from 0 to 1. To confirm that Vcompare>Vsshi_sel, a dithering process may be performed in which cal_sel<5:0> is decremented to reduce Vcompare by one increment (e.g., 10 mV), then cal_sel<5:0> is incremented to increase Vcompare by one increment (e.g., 10 mV). If Vcomp_out again transitions from 0 to 1, this confirms Vcompare and Vsshi_sel are approximately equal within a tolerance such as +/−5 mV or +/−2.5%. At this time, the calibration process is done (cal_done is set) and the value of cal_sel<5:0>=38 is stored for the selected ground node and partition. The corresponding leakage, _n<3:0>=14, can also be set, consistent with FIG. 11. This example selects a Vcompare (e.g., 280 mV) which is just below Vsshi_sel, to represent Vsshi_sel. Another option is to select a Vcompare (e.g., 290 mV) which is just above Vsshi_sel, to represent Vsshi_sel.

A plot 1208 indicates the value of leak_n<3:0>. 8 bits are used during the process which evaluates the level of Vsshi_sel, from tstart to tend, and 14 bits are used afterwards, as a leaker offset value. At this time, the local, selected value of Vsshi is adjusted to Vsshi_tgt, within a tolerance of +/−$\Delta$, where A can be no more than the step size in Vcompare, or no more than one half the step size in Vcompare, or some other value.

The time period from tstart to tend occurs in the common partition, and the time period after tend occurs in a particular nth data partition, datapar_n.

For this example, Vsshi_tgt is set to 0.2*VDD2=220 mV and ideally, Vsshi_sel=Vtarget. The selected Vsshi_sel has an offset of 65 mV from the targeted voltage, due to an IR drop or leakage delta in between the data partition and the common partition. The FSM will start running by sweeping the cal_sel<5:0> code start from mid code (code-32 in FIG. 11, where Voffset=0 V). The designer can define the granularity or step size of the RDAC2. The finer the step size, the lower the residual offset found after the calibration is done. However, the designer may need to judge in between accuracy, performance and area track off. In this example, the RDAC2 is design to have ~10 mV per step, as an example. As mentioned, when Vcompare is close to Vsshi_tgt, the comparator output starts dithering and the FSM will stop the calibration and store the current value of cal_sel<5:0>.

FIG. 13 depicts a flowchart of an example process for adjusting the leakage current in the leakage circuits 1030, 1036, 1038 and 1040 of FIG. 10A, in accordance with various embodiments. At step 1300, the finite state machine

15

16

(FSM) selects a partition (ground node) to evaluate. At step 1301, the FSM sets Vsshi_par_sel to couple the ground node of the selected partition to the inverting input of the comparator 1046 as Vsshi_sel. At step 1302, the FSM sets cal_sel<5:0> at a voltage source to provide an initial, nominal level of an output comparison voltage, Vcompare, to a non-inverting input of the comparator 1046. At step 1303, the FSM evaluates the output, Vcomp_out, of the comparator.

At a decision step 1304, the FSM determines whether Vcomp_out indicates Vsshi_sel>Vcompare. If the decision step is true (T), at step 1306, the FSM stores a code (leak_n<3:0>) to set the leakage current of the leakage circuit of the partition based on the level of Vsshi_sel. The dithering process of FIG. 12 is not depicted in the flowchart but may be used. Subsequently, the decision step 1307 determines whether there is a next partition to evaluate. If the decision step is true, step 1300 is reached. If the decision step 1307 is false (F), the process is done at step 1308. If the decision step 1304 is false, the FSM increases Vcompare by a step size at step 1305 and the decision step 1304 is repeated.

In sum, the process provides a smaller Vsshi gradient across the PHY. It benefits DDR5 read/write performance and supports higher bandwidths such as 6400-8400 MT/sec. in future client and server products. The same idea can be used for LPDDR5 PHY (VDD2=1.05V) when the process technology has scaled the EOS limits to 0.9V or below.

Moreover, the process is not limited to DDR5 memory, but can benefit any voltage bias generator design that is sensitive to IR drops or voltage gradients across the long footprint PHY. The techniques described can help continue scaling circuits without affecting DDR5 PHY design. This is important to keep Moore's Law alive.

FIG. 14 illustrates an example of components that may be present in a computing system 1450 for implementing the techniques (e.g., operations, processes, methods, and methodologies) described herein. The memory circuitry 1454 may store instructions and the processor circuitry 1452 may execute the instructions to perform the functions described herein including the process of FIG. 13. Any of the circuitry can be present in the partitions described herein.

The computing system 1450 may include any combinations of the hardware or logical components referenced herein. The components may be implemented as ICs, portions thereof, discrete electronic devices, or other modules, instruction sets, programmable logic or algorithms, hardware, hardware accelerators, software, firmware, or a combination thereof adapted in the computing system 1450, or as components otherwise incorporated within a chassis of a larger system. For one embodiment, at least one processor 1452 may be packaged together with computational logic 1482 and configured to practice aspects of various example embodiments described herein to form a System in Package (SiP) or a System on Chip (SoC).

The system 1450 includes processor circuitry in the form of one or more processors 1452. The processor circuitry 1452 includes circuitry such as, but not limited to one or more processor cores and one or more of cache memory, low drop-out voltage regulators (LDOs), interrupt controllers, serial interfaces such as SPI, I2C or universal programmable serial interface circuit, real time clock (RTC), timer-counters including interval and watchdog timers, general purpose I/O, memory card controllers such as secure digital/multi-media card (SD/MMC) or similar, interfaces, mobile industry processor interface (MIPI) interfaces and Joint Test Access Group (JTAG) test access ports. In some implementations, the processor circuitry 1452 may include one or more hardware accelerators (e.g., same or similar to acceleration circuitry 1464), which may be microprocessors, programmable processing devices (e.g., FPGA, ASIC, etc.), or the like. The one or more accelerators may include, for example, computer vision and/or deep learning accelerators. In some implementations, the processor circuitry 1452 may include on-chip memory circuitry, which may include any suitable volatile and/or non-volatile memory, such as DRAM, SRAM, EPROM, EEPROM, Flash memory, solid-state memory, and/or any other type of memory device technology, such as those discussed herein The processor circuitry 1452 may include, for example, one or more processor cores (CPUs), application processors, GPUs, RISC processors, Acorn RISC Machine (ARM) processors, CISC processors, one or more DSPs, one or more FPGAs, one or more PLDs, one or more ASICs, one or more baseband processors, one or more radio-frequency integrated circuits (RFIC), one or more microprocessors or controllers, a multi-core processor, a multithreaded processor, an ultra-low voltage processor, an embedded processor, or any other known processing elements, or any suitable combination thereof. The processors (or cores) 1452 may be coupled with or may include memory/storage and may be configured to execute instructions stored in the memory/storage to enable various applications or operating systems to run on the platform 1450. The processors (or cores) 1452 is configured to operate application software to provide a specific service to a user of the platform 1450. In some embodiments, the processor(s) 1452 may be a special-purpose processor(s)/controller(s) configured (or configurable) to operate according to the various embodiments herein.

As examples, the processor(s) 1452 may include an Intel® Architecture Core™ based processor such as an i3, an i5, an i7, an i9 based processor; an Intel® microcontroller-based processor such as a Quark™, an Atom™, or other MCU-based processor; Pentium® processor(s), Xeon® processor(s), or another such processor available from Intel® Corporation, Santa Clara, California. However, any number other processors may be used, such as one or more of Advanced Micro Devices (AMD) Zen® Architecture such as Ryzen® or EPYC® processor(s), Accelerated Processing Units (APUs), MxGPUs, Epyc® processor(s), or the like; A5-A12 and/or S1-S4 processor(s) from Apple® Inc., Snapdragon™ or Centrig™ processor(s) from Qualcomm® Technologies, Inc., Texas Instruments, Inc.® Open Multimedia Applications Platform (OMAP)™ processor(s); a MIPS-based design from MIPS Technologies, Inc. such as MIPS Warrior M-class, Warrior I-class, and Warrior P-class processors; an ARM-based design licensed from ARM Holdings, Ltd., such as the ARM Cortex-A, Cortex-R, and Cortex-M family of processors; the ThunderX2® provided by Cavium™, Inc.; or the like. In some implementations, the processor(s) 1452 may be a part of a system on a chip (SoC), System-in-Package (SiP), a multi-chip package (MCP), and/or the like, in which the processor(s) 1452 and other components are formed into a single integrated circuit, or a single package, such as the Edison™ or Galileo™ SoC boards from Intel® Corporation. Other examples of the processor(s) 1452 are mentioned elsewhere in the present disclosure.

The system 1450 may include or be coupled to acceleration circuitry 1464, which may be embodied by one or more AI/ML accelerators, a neural compute stick, neuromorphic hardware, an FPGA, an arrangement of GPUs, one or more SoCs (including programmable SoCs), one or more CPUs, one or more digital signal processors, dedicated ASICs (including programmable ASICs), PLDs such as complex (CPLDs) or high complexity PLDs (HCPLDs), and/or other forms of specialized processors or circuitry designed to accomplish one or more specialized tasks. These tasks may include AI/ML processing (e.g., including training, inferencing, and classification operations), visual data processing, network data processing, object detection, rule analysis, or the like. In FPGA-based implementations, the acceleration circuitry 1464 may comprise logic blocks or logic fabric and other interconnected resources that may be programmed (configured) to perform various functions, such as the procedures, methods, functions, etc. of the various embodiments discussed herein. In such implementations, the acceleration circuitry 1464 may also include memory cells (e.g., EPROM, EEPROM, flash memory, static memory (e.g., SRAM, anti-fuses, etc.) used to store logic blocks, logic fabric, data, etc. in LUTs and the like.

In some implementations, the processor circuitry 1452 and/or acceleration circuitry 1464 may include hardware elements specifically tailored for machine learning and/or artificial intelligence (AI) functionality. In these implementations, the processor circuitry 1452 and/or acceleration circuitry 1464 may be, or may include, an AI engine chip that can run many different kinds of AI instruction sets once loaded with the appropriate weightings and training code. Additionally or alternatively, the processor circuitry 1452 and/or acceleration circuitry 1464 may be, or may include, AI accelerator(s), which may be one or more of the aforementioned hardware accelerators designed for hardware acceleration of AI applications. As examples, these processor(s) or accelerators may be a cluster of artificial intelligence (AI) GPUs, tensor processing units (TPUs) developed by Google® Inc., Real AI Processors (RAPs™) provided by AlphaICs®, Nervana™ Neural Network Processors (NNPs) provided by Intel® Corp., Intel® Movidius™ Myriad™ X Vision Processing Unit (VPU), NVIDIA® PX™ based GPUs, the NM500 chip provided by General Vision®, Hardware 3 provided by Tesla®, Inc., an Epiphany™ based processor provided by Adapteva®, or the like. In some embodiments, the processor circuitry 1452 and/or acceleration circuitry 1464 and/or hardware accelerator circuitry may be implemented as AI accelerating co-processor(s), such as the Hexagon 685 DSP provided by Qualcomm®, the PowerVR 2NX Neural Net Accelerator (NNA) provided by Imagination Technologies Limited®, the Neural Engine core within the Apple® A11 or A12 Bionic SoC, the Neural Processing Unit (NPU) within the HiSilicon Kirin 970 provided by Huawei®, and/or the like. In some hardware-based implementations, individual subsystems of system 1450 may be operated by the respective AI accelerating co-processor(s), AI GPUs, TPUs, or hardware accelerators (e.g., FPGAs, ASICs, DSPs, SoCs, etc.), etc., that are configured with appropriate logic blocks, bit stream(s), etc. to perform their respective functions.

The system 1450 also includes system memory 1454. Any number of memory devices may be used to provide for a given amount of system memory. As examples, the memory 1454 may be, or include, volatile memory such as random access memory (RAM), static RAM (SRAM), dynamic RAM (DRAM), synchronous DRAM (SDRAM), RAMBUS® Dynamic Random Access Memory (RDRAM®), and/or any other desired type of volatile memory device. Additionally or alternatively, the memory 1454 may be, or include, non-volatile memory such as read-only memory (ROM), erasable programmable ROM (EPROM), electrically erasable programmable (EEPROM), flash memory, non-volatile RAM, ferroelectric RAM, phase-change memory (PCM), flash memory, and/or any other desired type of non-volatile memory device. Access to the memory 1454 is controlled by a memory controller. The individual memory devices may be of any number of different package types such as single die package (SDP), dual die package (DDP) or quad die package (Q17P). Any number of other memory implementations may be used, such as dual inline memory modules (DIMMs) of different varieties including but not limited to microDIMMs or MiniDIMMs.

Storage circuitry 1458 provides persistent storage of information such as data, applications, operating systems and so forth. In an example, the storage 1458 may be implemented via a solid-state disk drive (SSDD) and/or high-speed electrically erasable memory (commonly referred to as "flash memory"). Other devices that may be used for the storage 1458 include flash memory cards, such as SD cards, microSD cards, XD picture cards, and the like, and USB flash drives. In an example, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, phase change RAM (PRAM), resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a Domain Wall (DW) and Spin Orbit Transfer (SOT) based device, a thyristor based memory device, a hard disk drive (HDD), micro HDD, of a combination thereof, and/or any other memory. The memory circuitry 1454 and/or storage circuitry 1458 may also incorporate three-dimensional (3D) cross-point (XPOINT) memories from Intel® and Micron®.

The memory circuitry 1454 and/or storage circuitry 1458 is/are configured to store computational logic 1483 in the form of software, firmware, microcode, or hardware-level instructions to implement the techniques described herein. The computational logic 1483 may be employed to store working copies and/or permanent copies of programming instructions, or data to create the programming instructions, for the operation of various components of system 1450 (e.g., drivers, libraries, application programming interfaces (APIs), etc.), an operating system of system 1450, one or more applications, and/or for carrying out the embodiments discussed herein. The computational logic 1483 may be stored or loaded into memory circuitry 1454 as instructions 1482, or data to create the instructions 1482, which are then accessed for execution by the processor circuitry 1452 to carry out the functions described herein. The processor circuitry 1452 and/or the acceleration circuitry 1464 accesses the memory circuitry 1454 and/or the storage circuitry 1458 over the interconnect (IX) 1456. The instructions 1482 direct the processor circuitry 1452 to perform a specific sequence or flow of actions, for example, as described with respect to flowchart(s) and block diagram(s) of operations and functionality depicted previously. The various elements may be implemented by assembler instructions supported by processor circuitry 1452 or high-level languages that may be compiled into instructions 1488, or data to create the instructions 1488, to be executed by the processor circuitry 1452. The permanent copy of the programming instructions may be placed into persistent storage devices of storage circuitry 1458 in the factory or in the field through, for example, a distribution medium (not shown), through a communication interface (e.g., from a distribution server (not shown)), over-the-air (OTA), or any combination thereof.

The IX 1456 couples the processor 1452 to communication circuitry 1466 for communications with other devices, such as a remote server (not shown) and the like. The communication circuitry 1466 is a hardware element, or collection of hardware elements, used to communicate over one or more networks 1463 and/or with other devices. In one example, communication circuitry 1466 is, or includes, transceiver circuitry configured to enable wireless communications using any number of frequencies and protocols such as, for example, the Institute of Electrical and Electronics Engineers (IEEE) 802.11 (and/or variants thereof), IEEE 802.23.4, Bluetooth® and/or Bluetooth® low energy (BLE), ZigBee®, LoRaWAN™ (Long Range Wide Area Network), a cellular protocol such as 3GPP LTE and/or Fifth Generation (5G)/New Radio (NR), and/or the like. Additionally or alternatively, communication circuitry 1466 is, or includes, one or more network interface controllers (NICs) to enable wired communication using, for example, an Ethernet connection, Controller Area Network (CAN), Local Interconnect Network (LIN), DeviceNet, ControlNet, Data Highway+, or PROFINET, among many others.

The IX 1456 also couples the processor 1452 to interface circuitry 1470 that is used to connect system 1450 with one or more external devices 1472. The external devices 1472 may include, for example, sensors, actuators, positioning circuitry (e.g., global navigation satellite system (GNSS)/Global Positioning System (GPS) circuitry), client devices, servers, network appliances (e.g., switches, hubs, routers, etc.), integrated photonics devices (e.g., optical neural network (ONN) integrated circuit (IC) and/or the like), and/or other like devices.

In some optional examples, various input/output (I/O) devices may be present within or connected to, the system 1450, which are referred to as input circuitry 1486 and output circuitry 1484. The input circuitry 1486 and output circuitry 1484 include one or more user interfaces designed to enable user interaction with the platform 1450 and/or peripheral component interfaces designed to enable peripheral component interaction with the platform 1450. Input circuitry 1486 may include any physical or virtual means for accepting an input including, inter alia, one or more physical or virtual buttons (e.g., a reset button), a physical keyboard, keypad, mouse, touchpad, touchscreen, microphones, scanner, headset, and/or the like. The output circuitry 1484 may be included to show information or otherwise convey information, such as sensor readings, actuator position(s), or other like information. Data and/or graphics may be displayed on one or more user interface components of the output circuitry 1484. Output circuitry 1484 may include any number and/or combinations of audio or visual display, including, inter alia, one or more simple visual outputs/indicators (e.g., binary status indicators (e.g., light emitting diodes (LEDs)) and multi-character visual outputs, or more complex outputs such as display devices or touchscreens (e.g., Liquid Crystal Displays (LCD), LED displays, quantum dot displays, projectors, etc.), with the output of characters, graphics, multimedia objects, and the like being generated or produced from the operation of the platform 1450. The output circuitry 1484 may also include speakers and/or other audio emitting devices, printer(s), and/or the like. Additionally or alternatively, sensor(s) may be used as the input circuitry 1484 (e.g., an image capture device, motion capture device, or the like) and one or more actuators may be used as the output device circuitry 1484 (e.g., an actuator to provide haptic feedback or the like). Peripheral component interfaces may include, but are not limited to, a non-volatile memory port, a USB port, an audio jack, a power supply interface, etc. In some embodiments, a display or console hardware, in the context of the present system, may be used to provide output and receive input of an edge computing system; to manage components or services of an edge computing system; identify a state of an edge computing component or service; or to conduct any other number of management or administration functions or service use cases.

The components of the system 1450 may communicate over the IX 1456. The IX 1456 may include any number of technologies, including ISA, extended ISA, I2C, SPI, point-to-point interfaces, power management bus (PMBus), PCI, PCIe, PCIx, Intel® UPI, Intel® Accelerator Link, Intel® CXL, CAPI, OpenCAPI, Intel® QPI, UPI, Intel® OPA IX, RapidIO™ system IXs, CCIX, Gen-Z Consortium IXs, a HyperTransport interconnect, NVLink provided by NVIDIA®, a Time-Trigger Protocol (TTP) system, a FlexRay system, PROFIBUS, and/or any number of other IX technologies. The IX 1456 may be a proprietary bus, for example, used in a SoC based system.

The number, capability, and/or capacity of the elements of system 1450 may vary, depending on whether computing system 1450 is used as a stationary computing device (e.g., a server computer in a data center, a workstation, a desktop computer, etc.) or a mobile computing device (e.g., a smartphone, tablet computing device, laptop computer, game console, IoT device, etc.). In various implementations, the computing device system 1450 may comprise one or more components of a data center, a desktop computer, a workstation, a laptop, a smartphone, a tablet, a digital camera, a smart appliance, a smart home hub, a network appliance, and/or any other device/system that processes data.

The techniques described herein can be performed partially or wholly by software or other instructions provided in a machine-readable storage medium (e.g., memory). The software is stored as processor-executable instructions (e.g., instructions to implement any other processes discussed herein). Instructions associated with the flowchart (and/or various embodiments) and executed to implement embodiments of the disclosed subject matter may be implemented as part of an operating system or a specific application, component, program, object, module, routine, or other sequence of instructions or organization of sequences of instructions.

The storage medium can be a tangible machine readable medium such as read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs)), among others.

The storage medium may be included, e.g., in a communication device, a computing device, a network device, a personal digital assistant, a manufacturing tool, a mobile communication device, a cellular phone, a notebook computer, a tablet, a game console, a set top box, an embedded system, a TV (television), or a personal desktop computer.

Some non-limiting examples of various embodiments are presented below.

Example 1 includes an apparatus, comprising: a plurality of circuit partitions; a respective leakage circuit coupled to a ground node of each circuit partition; and a circuit coupled to the ground node of each circuit partition, wherein for each circuit partition, the circuit is to detect a voltage of the ground node and, based on the detected voltage, determine a leakage setting of the respective leakage circuit which adjusts the voltage of the ground node to a uniform target voltage.

Example 2 includes the apparatus of claim 1, wherein the uniform target voltage is a positive voltage which is a predetermined fraction of a supply voltage of the plurality of circuit partitions.

Example 3 includes the apparatus of claim 1 or 2, wherein for each circuit partition, the determination of the leakage setting occurs when the circuit partition is in an idle mode.

Example 4 includes the apparatus of any one of claims 1 to 3, wherein for each circuit partition, the determination of the leakage setting occurs before a memory reference code training.

Example 5 includes the apparatus of any one of claims 1 to 4, wherein for each circuit partition, the determination of the leakage setting occurs during each of a read, write and idle mode of the circuit partition.

Example 6 includes the apparatus of any one of claims 1 to 5, wherein for each circuit partition: to determine the voltage of the ground node, the circuit is to compare the voltage of the ground node to different comparison voltages, and identify one of the comparison voltages which is closest to the voltage of the ground node; and to determine the leakage setting, the circuit is to store a code, based on the one of the comparison voltages.

Example 7 includes the apparatus of any one of claims 1 to 6, wherein the circuit comprises an operational amplifier to set a target voltage at a node, and the ground nodes of the plurality of circuit partitions are coupled to the node and at different distances from the node.

Example 8 includes the apparatus of any one of claims 1 to 7, wherein the circuit comprises an operational amplifier to set a target voltage at a node, and the ground nodes of the plurality of circuit partitions are coupled to the node via respective paths which have different current x resistance drops.

Example 9 includes the apparatus of any one of claims 1 to 8, wherein the circuit comprises: a finite state machine; a comparator; a multiplexer having an output coupled to an inverting input of the comparator; and a voltage source coupled to a non-inverting input of the comparator, wherein the ground node of each circuit partition is input to the multiplexer, and the finite state machine is to apply a select signal to the multiplexer to couple one of the ground nodes at a time to the inverting input of the comparator.

Example 10 includes the apparatus of claim 9, wherein for each circuit partition, to detect the voltage of the ground node: the voltage source is to apply a sequence of comparison voltages to the non-inverting input of the comparator when the ground node is coupled to the inverting input of the comparator; and the finite state machine is to evaluate an output of the comparator to select one of the comparison voltages.

Example 11 includes the apparatus of any one of claims 1 to 10, wherein at least one of the circuit partitions comprises an unmatched receiver with decision feedback equalization.

Example 12 includes the apparatus of any one of claims 1 to 11, wherein at least one of the circuit partitions comprises a pull up driver.

Example 13 includes the apparatus of any one of claims 1 to 12, wherein for each circuit partition, the circuit is to periodically re-determine the leakage setting of the respective leakage circuit.

Example 14 include an apparatus, comprising: a leakage circuit coupled to a ground node of a circuit partition; and a circuit coupled to the ground node, wherein: the circuit is to detect a voltage of the ground node and, based on the detected voltage, determine a leakage setting of the leakage circuit which adjusts the voltage of the ground node to a positive voltage which is a predetermined fraction of a supply voltage of the circuit partition; the circuit is to store a code indicating the leakage setting; and the leakage circuit is responsive to the code to adjust a current leakage of the ground node.

Example 15 includes the apparatus of claim 14, wherein the circuit is to determine the leakage setting before a memory reference code training in a computing device, and to periodically re-determine the leakage setting after the memory reference code training.

Example 16 includes the apparatus of claim 14 or 15, wherein: the ground node is among multiple ground nodes; each ground node is associated with a respective circuit partition and a respective leakage circuit; the circuit is to detect voltages of a subset of the multiple ground nodes and, based on the detected voltages, determine leakage settings of the respective leakage circuits; and the circuit is to estimate a leakage setting for leakage circuits of one or more other ground nodes based on the determined leakage settings.

Example 17 includes an apparatus, comprising: a finite state machine; a voltage source coupled to the finite state machine; a comparator comprising a non-inverting input coupled to the voltage source and an inverting input coupled to a multiplexer, where the multiplexer is coupled to a plurality of ground nodes of respective circuit partitions; and a feedback path between an output of the comparator and an input of the finite state machine, wherein for each ground node, the finite state machine is to determine a respective voltage of the ground node based on an output of the comparator, and to adjust the respective voltage of the ground node to a common target voltage.

Example 18 includes the apparatus of claim 17, wherein the finite state machine is to determine the respective voltage of each ground node, one ground node at a time, by selecting each ground node via the multiplexer, and evaluating the output of the comparator.

Example 19 includes the apparatus of claim 17, further comprising an operational amplifier to set a target voltage at a node, wherein the ground nodes of the respective circuit partitions are coupled to the node via respective paths which have different current x resistance drops.

Example 20 includes the apparatus of claim 17, wherein: each of the ground nodes is coupled to a respective leakage circuit; the finite state machine is coupled to each of the respective leakage circuits; and for each ground node, to provide the ground node at the common target voltage, the finite state machine is to set a leakage current of the respective leakage circuit based on the determined respective voltage.

In the present detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

The terms "coupled," "communicatively coupled," along with derivatives thereof are used herein. The term "coupled" may mean two or more elements are in direct physical or electrical contact with one another, may mean that two or more elements indirectly contact each other but still cooperate or interact with each other, and/or may mean that one or more other elements are coupled or connected between the elements that are said to be coupled with each other. The term "directly coupled" may mean that two or more elements are in direct contact with one another. The term "communicatively coupled" may mean that two or more elements may be in contact with one another by a means of communication including through a wire or other interconnect connection, through a wireless communication channel or link, and/or the like.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus, comprising:
a plurality of circuit partitions;
a respective leakage circuit coupled to a ground node of each circuit partition; and
a circuit coupled to the ground node of each circuit partition, wherein for each circuit partition, the circuit is to detect a voltage of the ground node and, based on the detected voltage, determine a leakage setting of the respective leakage circuit which adjusts the voltage of the ground node to a uniform target voltage.

2. The apparatus of claim 1, wherein the uniform target voltage is a positive voltage which is a predetermined fraction of a supply voltage of the plurality of circuit partitions.

3. The apparatus of claim 1, wherein for each circuit partition, the determination of the leakage setting occurs when the circuit partition is in an idle mode.

4. The apparatus of claim 1, wherein for each circuit partition, the determination of the leakage setting occurs before a memory reference code training.

5. The apparatus of claim 1, wherein for each circuit partition, the determination of the leakage setting occurs during each of a read, write and idle mode of the circuit partition.

6. The apparatus of claim 1, wherein for each circuit partition:

to determine the voltage of the ground node, the circuit is to compare the voltage of the ground node to different comparison voltages, and identify one of the comparison voltages which is closest to the voltage of the ground node; and to determine the leakage setting, the circuit is to store a code, based on the one of the comparison voltages.

7. The apparatus of claim 1, wherein the circuit comprises an operational amplifier to set a target voltage at a node, and the ground nodes of the plurality of circuit partitions are coupled to the node and at different distances from the node.

8. The apparatus of claim 1, wherein the circuit comprises an operational amplifier to set a target voltage at a node, and the ground nodes of the plurality of circuit partitions are coupled to the node via respective paths which have different current x resistance drops.

9. The apparatus of claim 1, wherein the circuit comprises:

a finite state machine;

a comparator;

a multiplexer having an output coupled to an inverting input of the comparator; and a voltage source coupled to a non-inverting input of the comparator, wherein the ground node of each circuit partition is input to the multiplexer, and the finite state machine is to apply a select signal to the multiplexer to couple one of the ground nodes at a time to the inverting input of the comparator.

10. The apparatus of claim 9, wherein for each circuit partition, to detect the voltage of the ground node:

the voltage source is to apply a sequence of comparison voltages to the non-inverting input of the comparator when the ground node is coupled to the inverting input of the comparator; and the finite state machine is to evaluate an output of the comparator to select one of the comparison voltages.

11. The apparatus of claim 1, wherein at least one of the circuit partitions comprises an unmatched receiver with decision feedback equalization.

12. The apparatus of claim 1, wherein at least one of the circuit partitions comprises a pull up driver.

13. The apparatus of claim 1, wherein for each circuit partition, the circuit is to periodically re-determine the leakage setting of the respective leakage circuit.

14. An apparatus, comprising:

a leakage circuit coupled to a ground node of a circuit partition; and a circuit coupled to the ground node, wherein:

the circuit is to detect a voltage of the ground node and, based on the detected voltage, determine a leakage setting of the leakage circuit which adjusts the voltage of the ground node to a positive voltage which is a predetermined fraction of a supply voltage of the circuit partition;

the circuit is to store a code indicating the leakage setting; and the leakage circuit is responsive to the code to adjust a current leakage of the ground node.

15. The apparatus of claim 14, wherein the circuit is to determine the leakage setting before a memory reference code training in a computing device, and to periodically re-determine the leakage setting after the memory reference code training.

16. The apparatus of claim 14, wherein:

the ground node is among multiple ground nodes;

each ground node is associated with a respective circuit partition and a respective leakage circuit;

the circuit is to detect voltages of a subset of the multiple ground nodes and, based on the detected voltages, determine leakage settings of the respective leakage circuits; and the circuit is to estimate a leakage setting for leakage circuits of one or more other ground nodes based on the determined leakage settings.

17. An apparatus, comprising:

a finite state machine;

a voltage source coupled to the finite state machine;

a comparator comprising a non-inverting input coupled to the voltage source and an inverting input coupled to a multiplexer, where the multiplexer is coupled to a plurality of ground nodes of respective circuit partitions; and a feedback path between an output of the comparator and an input of the finite state machine, wherein for each ground node, the finite state machine is to determine a respective voltage of the ground node based on an output of the comparator, and to adjust the respective voltage of the ground node to a common target voltage.

18. The apparatus of claim 17, wherein the finite state machine is to determine the respective voltage of each ground node, one ground node at a time, by selecting each ground node via the multiplexer, and evaluating the output of the comparator.

19. The apparatus of claim 17, further comprising an operational amplifier to set a target voltage at a node, wherein the ground nodes of the respective circuit partitions are coupled to the node via respective paths which have different current x resistance drops.

20. The apparatus of claim 17, wherein:

each of the ground nodes is coupled to a respective leakage circuit;

the finite state machine is coupled to each of the respective leakage circuits; and for each ground node, to provide the ground node at the common target voltage, the finite state machine is to set a leakage current of the respective leakage circuit based on the determined respective voltage.

* * * * *